US009941922B2

(12) United States Patent
Manssen et al.

(10) Patent No.: US 9,941,922 B2
(45) Date of Patent: Apr. 10, 2018

(54) METHOD AND APPARATUS FOR MANAGING INTERFERENCE IN A COMMUNICATION DEVICE

(71) Applicant: BLACKBERRY LIMITED, Waterloo (CA)

(72) Inventors: Keith Manssen, Crystal Lake, IL (US); Matthew Russell Greene, Crystal Lake, IL (US); Wayne Smith, Crystal Lake, IL (US); David Schlueter, Lake Vllla, IL (US); John Spears, Johnsburg, IL (US)

(73) Assignee: BlackBerry Limited, Waterloo (CA)

( * ) Notice: Subject to any disclaimer, the term of this patent is extended or adjusted under 35 U.S.C. 154(b) by 0 days.

(21) Appl. No.: 15/250,351

(22) Filed: Aug. 29, 2016

(65) Prior Publication Data

US 2016/0373146 A1 Dec. 22, 2016

Related U.S. Application Data

(63) Continuation of application No. 14/483,911, filed on Sep. 11, 2014, now Pat. No. 9,450,637, which is a
(Continued)

(51) Int. Cl.
*H04B 1/00* (2006.01)
*H04B 1/401* (2015.01)
(Continued)

(52) U.S. Cl.
CPC ............. *H04B 1/401* (2013.01); *H01P 5/188* (2013.01); *H03H 7/38* (2013.01); *H03H 7/40* (2013.01);
(Continued)

(58) Field of Classification Search
CPC ...... H04B 1/401; H04B 1/0475; H04B 1/109; H04B 1/12; H04B 1/40; H04B 15/00; H04W 24/02
(Continued)

(56) References Cited

U.S. PATENT DOCUMENTS 2,745,067 A 5/1956 True
3,117,279 A 1/1964 Ludvigson
(Continued)

FOREIGN PATENT DOCUMENTS

CA 2914562 6/2016
CN 101640949 A 2/2010
(Continued)

OTHER PUBLICATIONS

Canadian Office Action, Application No. 2,821,173, dated Oct. 17, 2016.
(Continued)

*Primary Examiner* — April G Gonzales
(74) *Attorney, Agent, or Firm* — Guntin & Gust, PLC; David Terrell

(57) ABSTRACT

A system that incorporates teachings of the present disclosure may include, for example, a matching network including a tunable reactance circuit configured to be coupled to at least one of a transmitter portion and a receiver portion of a communication device, wherein the tunable reactance circuit is adjustable to a plurality of tuning states, and wherein the determination of a tuning state is based on parameters associated with a detected interference. Additional embodiments are disclosed.

20 Claims, 17 Drawing Sheets

Related U.S. Application Data continuation of application No. 13/090,583, filed on Apr. 20, 2011, now Pat. No. 8,860,526.

(60) Provisional application No. 61/326,206, filed on Apr. 20, 2010.

(51) Int. Cl.

| | | |
|---|---|---|
| *H03H 7/38* | (2006.01) | |
| *H03H 11/30* | (2006.01) | |
| *H03H 7/40* | (2006.01) | |
| *H04B 1/04* | (2006.01) | |
| *H04B 1/10* | (2006.01) | |
| *H04B 1/12* | (2006.01) | |
| *H04B 1/40* | (2015.01) | |
| *H04B 15/00* | (2006.01) | |
| *H04W 24/02* | (2009.01) | |
| *H01P 5/18* | (2006.01) | |

(52) U.S. Cl.
CPC ........... *H03H 11/30* (2013.01); *H04B 1/0475* (2013.01); *H04B 1/109* (2013.01); *H04B 1/1027* (2013.01); *H04B 1/12* (2013.01); *H04B 1/40* (2013.01); *H04B 15/00* (2013.01); *H04W 24/02* (2013.01)

(58) Field of Classification Search
USPC ........................................ 455/63.1
See application file for complete search history.

(56) References Cited

U.S. PATENT DOCUMENTS

| | | |
|---|---|---|
| 3,160,832 A | 12/1964 | Beitman |
| 3,390,337 A | 6/1968 | Beitman |
| 3,443,231 A | 5/1969 | Roza |
| 3,509,500 A | 4/1970 | McNair |
| 3,571,716 A | 3/1971 | Hill |
| 3,590,385 A | 6/1971 | Sabo |
| 3,601,717 A | 8/1971 | Kuecken |
| 3,742,279 A | 6/1973 | Kupsky |
| 3,749,491 A | 7/1973 | Maxfield |
| 3,794,941 A | 2/1974 | Templin |
| 3,919,644 A | 11/1975 | Smolka |
| 3,990,024 A | 11/1976 | Hou |
| 3,995,237 A | 11/1976 | Brunner |
| 4,186,359 A | 1/1980 | Kaegebein |
| 4,201,960 A | 5/1980 | Skutta |
| 4,227,256 A | 10/1980 | O'Keefe |
| 4,383,441 A | 5/1983 | Willis |
| 4,476,578 A | 10/1984 | Gaudin |
| 4,493,112 A | 1/1985 | Bruene |
| 4,509,019 A | 4/1985 | Banu et al. |
| 4,777,490 A | 10/1988 | Sharma |
| 4,799,066 A | 1/1989 | Deacon |
| 4,965,607 A | 10/1990 | Wilkins |
| 4,970,478 A | 11/1990 | Townley et al. |
| 4,980,656 A | 12/1990 | Duffalo |
| 5,032,805 A | 7/1991 | Elmer |
| 5,136,478 A | 8/1992 | Bruder |
| 5,142,255 A | 8/1992 | Chang |
| 5,177,670 A | 1/1993 | Shinohara |
| 5,195,045 A | 3/1993 | Keane |
| 5,200,826 A | 4/1993 | Seong |
| 5,212,463 A | 5/1993 | Babbitt |
| 5,215,463 A | 5/1993 | Babbitt |
| 5,216,392 A | 6/1993 | Fraser et al. |
| 5,230,091 A | 7/1993 | Vaisanen et al. |
| 5,243,358 A | 9/1993 | Sanford |
| 5,258,728 A | 11/1993 | Taniyoshi |
| 5,276,912 A | 1/1994 | Siwiak |
| 5,301,358 A | 4/1994 | Gaskill |
| 5,307,033 A | 4/1994 | Koscica |
| 5,310,358 A | 5/1994 | Johnson |
| 5,312,790 A | 5/1994 | Sengupta |
| 5,334,958 A | 8/1994 | Babbitt |
| 5,361,403 A | 11/1994 | Dent |
| 5,371,473 A | 12/1994 | Trinh |
| 5,409,889 A | 4/1995 | Das |
| 5,427,988 A | 6/1995 | Sengupta |
| 5,430,417 A | 7/1995 | Martin |
| 5,446,447 A | 8/1995 | Carney |
| 5,448,252 A | 9/1995 | Ali |
| 5,451,567 A | 9/1995 | Das |
| 5,451,914 A | 9/1995 | Stengel |
| 5,457,394 A | 10/1995 | McEwan |
| 5,472,935 A | 12/1995 | Yandrofski |
| 5,479,139 A | 12/1995 | Koscica |
| 5,486,491 A | 1/1996 | Sengupta |
| 5,496,795 A | 3/1996 | Das |
| 5,502,372 A | 3/1996 | Quan |
| 5,524,281 A | 6/1996 | Bradley |
| 5,548,837 A | 8/1996 | Hess et al. |
| 5,561,086 A | 10/1996 | Cygan |
| 5,561,407 A | 10/1996 | Koscica |
| 5,564,086 A | 10/1996 | Cygan |
| 5,583,359 A | 12/1996 | Ng et al. |
| 5,589,844 A | 12/1996 | Belcher et al. |
| 5,593,495 A | 1/1997 | Masuda |
| 5,635,433 A | 6/1997 | Sengupta |
| 5,635,434 A | 6/1997 | Sengupta |
| 5,640,042 A | 6/1997 | Koscica |
| 5,679,624 A | 10/1997 | Das |
| 5,689,219 A | 11/1997 | Piirainen |
| 5,693,429 A | 12/1997 | Sengupta |
| 5,694,134 A | 12/1997 | Barnes |
| 5,699,071 A | 12/1997 | Urakami |
| 5,721,194 A | 2/1998 | Yandrofski |
| 5,766,697 A | 6/1998 | Sengupta |
| 5,777,581 A | 7/1998 | Lilly |
| 5,778,308 A | 7/1998 | Sroka |
| 5,786,727 A | 7/1998 | Sigmon |
| 5,812,572 A | 9/1998 | King |
| 5,812,943 A | 9/1998 | Suzuki |
| 5,830,591 A | 11/1998 | Sengupta |
| 5,846,893 A | 12/1998 | Sengupta |
| 5,874,926 A | 2/1999 | Tsuru |
| 5,880,635 A | 3/1999 | Satoh |
| 5,886,867 A | 3/1999 | Chivukula |
| 5,892,482 A | 4/1999 | Coleman et al. |
| 5,926,751 A | 7/1999 | Vlahos et al. |
| 5,929,717 A | 7/1999 | Richardson |
| 5,940,030 A | 8/1999 | Hampel et al. |
| 5,963,871 A | 10/1999 | Zhinong |
| 5,969,582 A | 10/1999 | Boesch |
| 5,973,568 A | 10/1999 | Shapiro et al. |
| 5,982,099 A | 11/1999 | Barnes et al. |
| 5,990,766 A | 11/1999 | Zhang |
| 6,008,759 A | 12/1999 | Tangemann et al. |
| 6,009,124 A | 12/1999 | Smith |
| 6,020,787 A | 2/2000 | Kim |
| 6,020,795 A | 2/2000 | Kim |
| 6,029,075 A | 2/2000 | Das |
| 6,045,932 A | 4/2000 | Jia |
| 6,061,025 A | 5/2000 | Jackson |
| 6,064,865 A * | 5/2000 | Kuo ............... H04B 7/0857 455/135 |
| 6,074,971 A | 6/2000 | Chiu |
| 6,096,127 A | 8/2000 | Dimos |
| 6,100,733 A | 8/2000 | Dortu |
| 6,101,102 A | 8/2000 | Brand |
| 6,115,585 A | 9/2000 | Matero |
| 6,125,266 A | 9/2000 | Matero et al. |
| 6,133,868 A | 10/2000 | Butler et al. |
| 6,133,883 A | 10/2000 | Munson |
| 6,172,385 B1 | 1/2001 | Duncombe |
| 6,215,644 B1 | 4/2001 | Dhuler |
| 6,242,989 B1 | 6/2001 | Barber |
| 6,266,528 B1 | 7/2001 | Farzaneh |
| 6,281,748 B1 | 8/2001 | Klomsdorf et al. |
| 6,281,847 B1 | 8/2001 | Lee |
| 6,309,895 B1 | 10/2001 | Jaing |
| 6,343,208 B1 | 1/2002 | Ying |

(56) References Cited

U.S. PATENT DOCUMENTS

| | | |
|---|---|---|
| 6,377,142 B1 | 4/2002 | Chiu |
| 6,377,217 B1 | 4/2002 | Zhu |
| 6,377,440 B1 | 4/2002 | Zhu |
| 6,384,785 B1 | 5/2002 | Kamogawa |
| 6,404,614 B1 | 6/2002 | Zhu |
| 6,408,190 B1 | 6/2002 | Ying |
| 6,414,562 B1 | 7/2002 | Bouisse |
| 6,415,562 B1 | 7/2002 | Donaghue |
| 6,438,360 B1 | 8/2002 | Alberth, Jr. et al. |
| 6,452,776 B1 | 9/2002 | Chakravorty |
| 6,461,930 B2 | 10/2002 | Akram |
| 6,466,774 B1 | 10/2002 | Okabe |
| 6,492,883 B2 | 12/2002 | Liang |
| 6,514,895 B1 | 2/2003 | Chiu |
| 6,525,630 B1 | 2/2003 | Zhu |
| 6,531,936 B1 | 3/2003 | Chiu |
| 6,535,076 B2 | 3/2003 | Partridge |
| 6,535,722 B1 | 3/2003 | Rosen |
| 6,538,603 B1 | 3/2003 | Chen |
| 6,556,102 B1 | 4/2003 | Sengupta |
| 6,556,814 B1 | 4/2003 | Klomsdorf |
| 6,570,462 B2 | 5/2003 | Edmonson |
| 6,590,468 B2 | 7/2003 | du Toit |
| 6,590,541 B1 | 7/2003 | Schultze |
| 6,597,265 B2 | 7/2003 | Liang |
| 6,608,603 B2 * | 8/2003 | Alexopoulos ............ H03H 7/40 330/144 |
| 6,624,786 B2 | 9/2003 | Boyle |
| 6,628,962 B1 | 9/2003 | Katsura et al. |
| 6,640,085 B1 | 10/2003 | Chatzipetros |
| 6,657,595 B1 | 12/2003 | Phillips |
| 6,661,638 B2 | 12/2003 | Jackson |
| 6,670,256 B2 | 12/2003 | Yang |
| 6,710,651 B2 | 3/2004 | Forrester |
| 6,724,611 B1 | 4/2004 | Mosley |
| 6,724,890 B1 | 4/2004 | Bareis |
| 6,737,179 B2 | 5/2004 | Sengupta |
| 6,747,522 B2 | 6/2004 | Pietruszynski et al. |
| 6,759,918 B2 | 7/2004 | Du Toit |
| 6,765,540 B2 | 7/2004 | Toncich |
| 6,768,472 B2 | 7/2004 | Alexopoulos |
| 6,774,077 B2 | 8/2004 | Sengupta |
| 6,795,712 B1 | 9/2004 | Vakilian |
| 6,825,818 B2 | 11/2004 | Toncich |
| 6,839,028 B2 | 1/2005 | Lee |
| 6,845,126 B2 | 1/2005 | Dent |
| 6,859,104 B2 | 2/2005 | Toncich |
| 6,862,432 B1 | 3/2005 | Kim |
| 6,864,757 B2 | 3/2005 | Du Toit |
| 6,868,260 B2 | 3/2005 | Jagielski |
| 6,875,655 B2 | 4/2005 | Lin |
| 6,882,245 B2 * | 4/2005 | Utsunomiya ........ H03H 7/0153 333/17.1 |
| 6,888,714 B2 | 5/2005 | Shaw |
| 6,905,989 B2 | 6/2005 | Ellis |
| 6,906,653 B2 | 6/2005 | Uno |
| 6,907,234 B2 | 6/2005 | Karr |
| 6,914,487 B1 | 7/2005 | Doyle et al. |
| 6,920,315 B1 | 7/2005 | Wilcox et al. |
| 6,922,330 B2 | 7/2005 | Nielsen |
| 6,943,078 B1 | 9/2005 | Zheng |
| 6,946,847 B2 | 9/2005 | Nishimori |
| 6,949,442 B2 | 9/2005 | Barth |
| 6,961,368 B2 | 11/2005 | Dent et al. |
| 6,964,296 B2 | 11/2005 | Memory |
| 6,965,837 B2 | 11/2005 | Vintola |
| 6,987,493 B2 * | 1/2006 | Chen ..................... H01Q 1/246 343/817 |
| 6,993,297 B2 | 1/2006 | Smith |
| 6,999,297 B1 | 2/2006 | Klee |
| 7,009,455 B2 | 3/2006 | Toncich |
| 7,071,776 B2 | 7/2006 | Forrester |
| 7,106,715 B1 | 9/2006 | Kelton |
| 7,107,033 B2 | 9/2006 | D du Toit |
| 7,113,614 B2 | 9/2006 | Rhoads |
| 7,151,411 B2 | 12/2006 | Martin |
| 7,176,634 B2 | 2/2007 | Kitamura |
| 7,176,845 B2 | 2/2007 | Fabrega-Sanchez |
| 7,180,467 B2 | 2/2007 | Fabrega-Sanchez |
| 7,218,186 B2 * | 5/2007 | Chen ..................... H01P 5/185 333/116 |
| 7,221,327 B2 | 5/2007 | Toncich |
| 7,298,329 B2 | 11/2007 | Diament |
| 7,299,018 B2 | 11/2007 | Van Rumpt |
| 7,312,118 B2 | 12/2007 | Kiyotoshi |
| 7,332,980 B2 | 2/2008 | Zhu |
| 7,332,981 B2 | 2/2008 | Matsuno |
| 7,339,527 B2 | 3/2008 | Sager |
| 7,369,828 B2 | 5/2008 | Shamsaifar |
| 7,426,373 B2 | 9/2008 | Clingman |
| 7,427,949 B2 | 9/2008 | Channabasappa et al. |
| 7,453,405 B2 | 11/2008 | Nishikido et al. |
| 7,468,638 B1 | 12/2008 | Tsai |
| 7,469,129 B2 | 12/2008 | Blaker et al. |
| 7,528,674 B2 | 5/2009 | Kato et al. |
| 7,531,011 B2 | 5/2009 | Yamasaki |
| 7,535,080 B2 | 5/2009 | Zeng et al. |
| 7,535,312 B2 | 5/2009 | McKinzie |
| 7,539,527 B2 | 5/2009 | Jang |
| 7,557,507 B2 | 7/2009 | Wu |
| 7,567,782 B2 | 7/2009 | Liu et al. |
| 7,596,357 B2 | 9/2009 | Nakamata |
| 7,633,355 B2 | 12/2009 | Matsuo |
| 7,642,879 B2 | 1/2010 | Matsuno |
| 7,655,530 B2 | 2/2010 | Hosking |
| 7,667,663 B2 | 2/2010 | Hsiao |
| 7,671,693 B2 * | 3/2010 | Brobston ................. H03H 7/40 333/17.3 |
| 7,705,692 B2 | 4/2010 | Fukamachi et al. |
| 7,711,337 B2 | 5/2010 | McKinzie |
| 7,714,676 B2 | 5/2010 | McKinzie |
| 7,714,678 B2 | 5/2010 | du Toit |
| 7,728,693 B2 | 6/2010 | du Toit |
| 7,760,699 B1 | 7/2010 | Malik |
| 7,768,400 B2 | 8/2010 | Lawrence et al. |
| 7,786,819 B2 | 8/2010 | Ella |
| 7,795,990 B2 | 9/2010 | du Toit |
| 7,830,320 B2 | 11/2010 | Shamblin et al. |
| 7,852,170 B2 | 12/2010 | McKinzie |
| 7,856,228 B2 | 12/2010 | Lekutai et al. |
| 7,865,154 B2 | 1/2011 | Mendolia |
| 7,907,094 B2 | 3/2011 | Kakitsu et al. |
| 7,917,104 B2 | 3/2011 | Manssen et al. |
| 7,940,223 B2 | 5/2011 | Dou et al. |
| 7,949,309 B2 | 5/2011 | Rofougaran |
| 7,969,257 B2 | 6/2011 | du Toit |
| 7,983,615 B2 | 7/2011 | Bryce et al. |
| 7,991,363 B2 | 8/2011 | Greene |
| 8,008,982 B2 | 8/2011 | McKinzie |
| 8,072,285 B2 | 12/2011 | Spears |
| 8,112,043 B2 | 2/2012 | Knudsen et al. |
| 8,170,510 B2 | 5/2012 | Knudsen et al. |
| 8,190,109 B2 | 5/2012 | Ali et al. |
| 8,204,446 B2 | 6/2012 | Scheer |
| 8,213,886 B2 | 7/2012 | Blin |
| 8,217,731 B2 * | 7/2012 | McKinzie, III .......... H03H 7/38 333/17.3 |
| 8,217,732 B2 | 7/2012 | McKinzie |
| 8,299,867 B2 | 10/2012 | McKinzie |
| 8,320,850 B1 | 11/2012 | Khlat |
| 8,325,097 B2 | 12/2012 | McKinzie, III et al. |
| 8,405,563 B2 | 3/2013 | McKinzie et al. |
| 8,421,548 B2 | 4/2013 | Spears et al. |
| 8,432,234 B2 * | 4/2013 | Manssen ................. H03H 7/40 333/17.3 |
| 8,442,457 B2 | 5/2013 | Harel et al. |
| 8,454,882 B2 | 6/2013 | Chan et al. |
| 8,457,569 B2 | 6/2013 | Blin |
| 8,472,888 B2 | 6/2013 | Manssen et al. |
| 8,478,344 B2 | 7/2013 | Rofougaran et al. |
| 8,543,123 B2 | 9/2013 | Moon et al. |
| 8,543,176 B1 | 9/2013 | Daniel et al. |
| 8,558,633 B2 | 10/2013 | McKinzie, III |
| 8,564,381 B2 | 10/2013 | McKinzie |

(56) References Cited

U.S. PATENT DOCUMENTS

| | | |
|---|---|---|
| 8,594,584 B2 | 11/2013 | Greene et al. |
| 8,620,236 B2 | 12/2013 | Manssen et al. |
| 8,620,246 B2 | 12/2013 | McKinzie et al. |
| 8,620,247 B2 | 12/2013 | McKinzie et al. |
| 8,655,286 B2 | 2/2014 | Mendolia |
| 8,674,783 B2 | 3/2014 | Spears et al. |
| 8,680,934 B2 * | 3/2014 | McKinzie, III .......... H03H 7/40 333/17.3 |
| 8,693,963 B2 | 4/2014 | du Toit et al. |
| 8,712,340 B2 * | 4/2014 | Hoirup ................... H01Q 1/242 455/67.11 |
| 8,773,019 B2 | 7/2014 | Pham et al. |
| 8,774,743 B2 | 7/2014 | Ali et al. |
| 8,787,845 B2 | 7/2014 | Manssen et al. |
| 8,803,631 B2 | 8/2014 | Greene et al. |
| 8,860,525 B2 | 10/2014 | Spears et al. |
| 8,948,889 B2 | 2/2015 | Spears et al. |
| 8,957,742 B2 | 2/2015 | Spears et al. |
| 9,026,062 B2 | 5/2015 | Greene et al. |
| 9,083,405 B2 | 7/2015 | Christoffersson et al. |
| 9,119,152 B2 | 8/2015 | Blin |
| 9,231,643 B2 | 1/2016 | Greene et al. |
| 9,374,113 B2 | 6/2016 | Manssen et al. |
| 9,473,194 B2 | 10/2016 | Domino et al. |
| 9,698,758 B2 | 7/2017 | Spears et al. |
| 9,698,858 B2 | 7/2017 | Hoirup et al. |
| 2002/0008672 A1 | 1/2002 | Gothard |
| 2002/0030566 A1 | 3/2002 | Bozler |
| 2002/0047154 A1 | 4/2002 | Sowlati et al. |
| 2002/0079982 A1 | 6/2002 | Lafleur et al. |
| 2002/0109642 A1 | 8/2002 | Gee et al. |
| 2002/0118075 A1 | 8/2002 | Ohwada |
| 2002/0145483 A1 | 10/2002 | Bouisse |
| 2002/0167963 A1 | 11/2002 | Joa-Ng |
| 2002/0183013 A1 | 12/2002 | Auckland et al. |
| 2002/0187780 A1 | 12/2002 | Souissi |
| 2002/0191703 A1 | 12/2002 | Ling |
| 2002/0193088 A1 | 12/2002 | Jung |
| 2003/0060227 A1 | 3/2003 | Sekine |
| 2003/0071300 A1 | 4/2003 | Yashima |
| 2003/0114124 A1 | 6/2003 | Higuchi |
| 2003/0137464 A1 | 7/2003 | Foti et al. |
| 2003/0142022 A1 | 7/2003 | Ollikainen |
| 2003/0184319 A1 | 10/2003 | Nishimori et al. |
| 2003/0193997 A1 | 10/2003 | Dent |
| 2003/0199286 A1 | 10/2003 | D du Toit |
| 2003/0210203 A1 | 11/2003 | Phillips et al. |
| 2003/0210206 A1 | 11/2003 | Phillips et al. |
| 2003/0216150 A1 | 11/2003 | Ueda |
| 2003/0232607 A1 | 12/2003 | Le Bars |
| 2004/0009754 A1 * | 1/2004 | Smith, Jr. ................. H03H 7/40 455/82 |
| 2004/0090372 A1 | 5/2004 | Nallo |
| 2004/0100341 A1 | 5/2004 | Luetzelschwab |
| 2004/0125027 A1 | 7/2004 | Rubinshteyn et al. |
| 2004/0127178 A1 | 7/2004 | Kuffner |
| 2004/0137950 A1 | 7/2004 | Bolin |
| 2004/0202399 A1 | 10/2004 | Kochergin |
| 2004/0204027 A1 | 10/2004 | Park et al. |
| 2004/0227176 A1 | 11/2004 | York |
| 2004/0232982 A1 * | 11/2004 | Ichitsubo ................. H01L 23/66 330/129 |
| 2004/0257293 A1 | 12/2004 | Friedrich |
| 2004/0263411 A1 | 12/2004 | Fabrega-Sanchez et al. |
| 2004/0264610 A1 | 12/2004 | Marro et al. |
| 2005/0007291 A1 | 1/2005 | Fabrega-Sanchez |
| 2005/0032488 A1 | 2/2005 | Pehlke |
| 2005/0032541 A1 | 2/2005 | Wang |
| 2005/0042994 A1 | 2/2005 | Otaka |
| 2005/0059362 A1 | 3/2005 | Kalajo |
| 2005/0082636 A1 | 4/2005 | Yashima |
| 2005/0085204 A1 | 4/2005 | Poilasne et al. |
| 2005/0093624 A1 | 5/2005 | Forrester et al. |
| 2005/0130608 A1 | 6/2005 | Forse |
| 2005/0130699 A1 | 6/2005 | Kim |
| 2005/0145987 A1 | 7/2005 | Okuda et al. |
| 2005/0208960 A1 | 9/2005 | Hassan |
| 2005/0215204 A1 | 9/2005 | Wallace |
| 2005/0227627 A1 | 10/2005 | Cyr et al. |
| 2005/0227633 A1 * | 10/2005 | Dunko .................... H01Q 1/242 455/90.3 |
| 2005/0259011 A1 | 11/2005 | Vance |
| 2005/0260962 A1 | 11/2005 | Nazrul et al. |
| 2005/0264455 A1 | 12/2005 | Talvitie |
| 2005/0280588 A1 * | 12/2005 | Fujikawa ............... H01Q 1/242 343/702 |
| 2005/0282503 A1 | 12/2005 | Onno |
| 2006/0003537 A1 | 1/2006 | Sinha |
| 2006/0009165 A1 | 1/2006 | Alles |
| 2006/0022882 A1 | 2/2006 | Gerder et al. |
| 2006/0030277 A1 | 2/2006 | Cyr et al. |
| 2006/0077082 A1 | 4/2006 | Shanks et al. |
| 2006/0099915 A1 | 5/2006 | Laroia et al. |
| 2006/0099952 A1 | 5/2006 | Prehofer et al. |
| 2006/0119511 A1 * | 6/2006 | Collinson ............... H01Q 3/267 342/368 |
| 2006/0148415 A1 * | 7/2006 | Hamalainen ......... H04B 7/0634 455/69 |
| 2006/0160501 A1 | 7/2006 | Mendolia |
| 2006/0183431 A1 | 8/2006 | Chang et al. |
| 2006/0183433 A1 | 8/2006 | Mori et al. |
| 2006/0183442 A1 | 8/2006 | Chang et al. |
| 2006/0195161 A1 * | 8/2006 | Li ..................... A61N 1/37223 607/60 |
| 2006/0205368 A1 | 9/2006 | Bustamante |
| 2006/0252391 A1 | 11/2006 | Poilasne et al. |
| 2006/0281423 A1 | 12/2006 | Caimi |
| 2007/0001924 A1 * | 1/2007 | Hirabayashi ............. H01Q 3/44 343/893 |
| 2007/0013483 A1 | 1/2007 | Stewart |
| 2007/0035458 A1 * | 2/2007 | Ohba ..................... H01Q 1/243 343/702 |
| 2007/0042725 A1 | 2/2007 | Poilasne |
| 2007/0042734 A1 | 2/2007 | Ryu |
| 2007/0063788 A1 | 3/2007 | Zhu |
| 2007/0077956 A1 | 4/2007 | Julian et al. |
| 2007/0080888 A1 | 4/2007 | Mohamadi |
| 2007/0082611 A1 | 4/2007 | Terranova et al. |
| 2007/0085609 A1 | 4/2007 | Itkin |
| 2007/0091006 A1 | 4/2007 | Thober et al. |
| 2007/0093282 A1 | 4/2007 | Chang et al. |
| 2007/0109716 A1 | 5/2007 | Martin et al. |
| 2007/0111681 A1 | 5/2007 | Alberth et al. |
| 2007/0121267 A1 | 5/2007 | Kotani et al. |
| 2007/0142011 A1 | 6/2007 | Shatara |
| 2007/0142014 A1 | 6/2007 | Wilcox |
| 2007/0149146 A1 | 6/2007 | Hwang |
| 2007/0171879 A1 | 7/2007 | Bourque |
| 2007/0182636 A1 | 8/2007 | Carlson |
| 2007/0184825 A1 | 8/2007 | Lim et al. |
| 2007/0194859 A1 | 8/2007 | Brobston et al. |
| 2007/0197180 A1 | 8/2007 | McKinzie et al. |
| 2007/0200766 A1 | 8/2007 | McKinzie |
| 2007/0200773 A1 | 8/2007 | Dou et al. |
| 2007/0210899 A1 | 9/2007 | Kato et al. |
| 2007/0222697 A1 | 9/2007 | Caimi et al. |
| 2007/0248238 A1 * | 10/2007 | Abreu ..................... G02C 3/003 381/381 |
| 2007/0285326 A1 | 12/2007 | McKinzie |
| 2007/0293176 A1 | 12/2007 | Yu |
| 2008/0007478 A1 | 1/2008 | Jung |
| 2008/0018541 A1 | 1/2008 | Pang |
| 2008/0030165 A1 * | 2/2008 | Lisac ..................... H02M 3/158 320/103 |
| 2008/0055016 A1 | 3/2008 | Morris |
| 2008/0055168 A1 * | 3/2008 | Massey ................... H04B 1/18 343/703 |
| 2008/0081670 A1 | 4/2008 | Rofougaran |
| 2008/0090539 A1 | 4/2008 | Thompson |
| 2008/0094149 A1 | 4/2008 | Brobston |
| 2008/0106350 A1 | 5/2008 | McKinzie |
| 2008/0111748 A1 | 5/2008 | Dunn et al. |
| 2008/0122553 A1 | 5/2008 | McKinzie |

(56) References Cited

U.S. PATENT DOCUMENTS

| | | |
|---|---|---|
| 2008/0122723 A1 | 5/2008 | Rofougaran |
| 2008/0129612 A1 | 6/2008 | Wang |
| 2008/0158076 A1 | 7/2008 | Walley |
| 2008/0174508 A1 | 7/2008 | Iwai et al. |
| 2008/0261544 A1 | 10/2008 | Blin |
| 2008/0266190 A1 | 10/2008 | Ohba et al. |
| 2008/0274706 A1 | 11/2008 | Blin |
| 2008/0280570 A1 | 11/2008 | Blin |
| 2008/0285729 A1 | 11/2008 | Glasgow et al. |
| 2008/0288028 A1 | 11/2008 | Larson et al. |
| 2008/0294718 A1 | 11/2008 | Okano |
| 2008/0300027 A1 | 12/2008 | Dou |
| 2008/0305749 A1 | 12/2008 | Ben-Bassat |
| 2008/0305750 A1 | 12/2008 | Alon et al. |
| 2008/0309617 A1 | 12/2008 | Kong et al. |
| 2009/0002077 A1 | 1/2009 | Rohani et al. |
| 2009/0027286 A1 | 1/2009 | Ohishi |
| 2009/0039976 A1 | 2/2009 | McKinzie, III |
| 2009/0051611 A1 | 2/2009 | Shamblin et al. |
| 2009/0082017 A1 | 3/2009 | Chang et al. |
| 2009/0088093 A1 | 4/2009 | Nentwig et al. |
| 2009/0109880 A1 | 4/2009 | Kim et al. |
| 2009/0121963 A1 | 5/2009 | Greene |
| 2009/0149136 A1 | 6/2009 | Rofougaran |
| 2009/0180403 A1 | 7/2009 | Tudosoiu |
| 2009/0184879 A1 | 7/2009 | Derneryd |
| 2009/0196192 A1 | 8/2009 | Lim et al. |
| 2009/0215446 A1 | 8/2009 | Hapsari et al. |
| 2009/0231220 A1 | 9/2009 | Zhang et al. |
| 2009/0253385 A1 | 10/2009 | Dent et al. |
| 2009/0264065 A1 | 10/2009 | Song |
| 2009/0278685 A1 | 11/2009 | Potyrailo |
| 2009/0295651 A1 | 12/2009 | Dou et al. |
| 2009/0323572 A1 | 12/2009 | Shi et al. |
| 2009/0323582 A1 | 12/2009 | Proctor et al. |
| 2010/0041348 A1 | 2/2010 | Wilcox et al. |
| 2010/0053009 A1 | 3/2010 | Rofougaran |
| 2010/0060531 A1 | 3/2010 | Rappaport |
| 2010/0073103 A1* | 3/2010 | Spears .................. H03H 7/40 333/17.3 |
| 2010/0085260 A1 | 4/2010 | McKinzie |
| 2010/0085884 A1 | 4/2010 | Srinivasan et al. |
| 2010/0105425 A1 | 4/2010 | Asokan |
| 2010/0107067 A1* | 4/2010 | Vaisanen ............... G06F 3/0486 715/702 |
| 2010/0134215 A1* | 6/2010 | Lee ..................... H01P 7/082 333/235 |
| 2010/0156552 A1 | 6/2010 | McKinzie |
| 2010/0164640 A1 | 7/2010 | McKinzie |
| 2010/0164641 A1 | 7/2010 | McKinzie |
| 2010/0214189 A1 | 8/2010 | Kanazawa |
| 2010/0232474 A1 | 9/2010 | Rofougaran |
| 2010/0244576 A1 | 9/2010 | Hillan et al. |
| 2010/0277363 A1 | 11/2010 | Kainulainen et al. |
| 2010/0285836 A1 | 11/2010 | Horihata et al. |
| 2010/0302106 A1 | 12/2010 | Knudsen et al. |
| 2010/0304684 A1 | 12/2010 | Duron et al. |
| 2010/0304688 A1 | 12/2010 | Knudsen et al. |
| 2011/0002080 A1 | 1/2011 | Ranta |
| 2011/0012790 A1 | 1/2011 | Badaruzzaman |
| 2011/0012792 A1 | 1/2011 | Krenz |
| 2011/0014879 A1 | 1/2011 | Alberth et al. |
| 2011/0014886 A1 | 1/2011 | Manssen |
| 2011/0019606 A1 | 1/2011 | Umeda et al. |
| 2011/0026415 A1 | 2/2011 | Kamuf et al. |
| 2011/0039504 A1 | 2/2011 | Nguyen et al. |
| 2011/0043298 A1 | 2/2011 | McKinzie |
| 2011/0043328 A1 | 2/2011 | Bassali |
| 2011/0053524 A1 | 3/2011 | Manssen |
| 2011/0063042 A1 | 3/2011 | Mendolia |
| 2011/0086600 A1 | 4/2011 | Muhammad |
| 2011/0086630 A1 | 4/2011 | Manssen |
| 2011/0102290 A1 | 5/2011 | Milosavljevic |
| 2011/0105023 A1 | 5/2011 | Scheer et al. |
| 2011/0116395 A1 | 5/2011 | Tsuda et al. |
| 2011/0116423 A1 | 5/2011 | Rousu et al. |
| 2011/0117863 A1 | 5/2011 | Camp, Jr. et al. |
| 2011/0117973 A1 | 5/2011 | Asrani et al. |
| 2011/0121079 A1 | 5/2011 | Lawrence et al. |
| 2011/0122040 A1* | 5/2011 | Wakabayashi ......... H01Q 1/243 343/833 |
| 2011/0133994 A1 | 6/2011 | Korva |
| 2011/0140982 A1 | 6/2011 | Ozden et al. |
| 2011/0183628 A1 | 7/2011 | Baker |
| 2011/0183633 A1 | 7/2011 | Ohba et al. |
| 2011/0195679 A1 | 8/2011 | Lee et al. |
| 2011/0227666 A1 | 9/2011 | Manssen |
| 2011/0237207 A1 | 9/2011 | Bauder |
| 2011/0249760 A1 | 10/2011 | Chrisikos et al. |
| 2011/0250852 A1 | 10/2011 | Greene |
| 2011/0254637 A1 | 10/2011 | Manssen |
| 2011/0254638 A1 | 10/2011 | Manssen |
| 2011/0256857 A1 | 10/2011 | Chen et al. |
| 2011/0281532 A1 | 11/2011 | Shin et al. |
| 2011/0285511 A1 | 11/2011 | Maguire et al. |
| 2011/0299438 A1* | 12/2011 | Mikhemar ........... H04B 1/0458 370/280 |
| 2011/0306310 A1 | 12/2011 | Bai |
| 2011/0309980 A1* | 12/2011 | Ali ..................... H01Q 1/1257 342/368 |
| 2012/0039189 A1 | 2/2012 | Suzuki et al. |
| 2012/0051409 A1 | 3/2012 | Brobston et al. |
| 2012/0062431 A1 | 3/2012 | Tikka et al. |
| 2012/0075159 A1 | 3/2012 | Chang |
| 2012/0084537 A1 | 4/2012 | Indukuru |
| 2012/0094708 A1 | 4/2012 | Park |
| 2012/0099462 A1 | 4/2012 | Yuda et al. |
| 2012/0100802 A1 | 4/2012 | Mohebbi |
| 2012/0112851 A1 | 5/2012 | Manssen |
| 2012/0112852 A1 | 5/2012 | Manssen et al. |
| 2012/0112970 A1 | 5/2012 | Mow et al. |
| 2012/0119843 A1 | 5/2012 | du Toit et al. |
| 2012/0119844 A1 | 5/2012 | du Toit et al. |
| 2012/0139810 A1 | 6/2012 | Faraone et al. |
| 2012/0154975 A1 | 6/2012 | Oakes |
| 2012/0214421 A1 | 8/2012 | Hoirup et al. |
| 2012/0220243 A1 | 8/2012 | Mendolia |
| 2012/0243579 A1 | 9/2012 | Premakanthan et al. |
| 2012/0286586 A1 | 11/2012 | Balm |
| 2012/0293384 A1 | 11/2012 | Knudsen et al. |
| 2012/0295554 A1 | 11/2012 | Greene |
| 2012/0295555 A1 | 11/2012 | Greene et al. |
| 2012/0309332 A1 | 12/2012 | Liao et al. |
| 2013/0005277 A1 | 1/2013 | Klomsdorf et al. |
| 2013/0052967 A1 | 2/2013 | Black et al. |
| 2013/0056841 A1 | 3/2013 | Hsieh et al. |
| 2013/0076579 A1* | 3/2013 | Zhang ..................... H01Q 1/243 343/720 |
| 2013/0076580 A1* | 3/2013 | Zhang ..................... H01Q 1/243 343/720 |
| 2013/0106332 A1 | 5/2013 | Williams et al. |
| 2013/0122829 A1 | 5/2013 | Hyvonen et al. |
| 2013/0137384 A1 | 5/2013 | Desclos et al. |
| 2013/0154897 A1 | 6/2013 | Sorensen et al. |
| 2013/0182583 A1 | 7/2013 | Siomina et al. |
| 2013/0194054 A1 | 8/2013 | Presti |
| 2013/0215846 A1 | 8/2013 | Yerrabommanahalli et al. |
| 2013/0231155 A1 | 9/2013 | Sheynman et al. |
| 2013/0265912 A1 | 10/2013 | Ikonen et al. |
| 2013/0293425 A1* | 11/2013 | Zhu ........................ H01Q 1/243 343/702 |
| 2013/0315285 A1 | 11/2013 | Black et al. |
| 2014/0002323 A1 | 1/2014 | Ali et al. |
| 2014/0009360 A1 | 1/2014 | Ikonen et al. |
| 2014/0162572 A1 | 6/2014 | Hirabayashi |
| 2014/0210686 A1 | 7/2014 | Ali et al. |
| 2014/0287698 A1 | 9/2014 | Ali et al. |
| 2016/0173172 A1 | 6/2016 | Greene |
| 2016/0241276 A1 | 8/2016 | Zhu |
| 2016/0269055 A1 | 9/2016 | Greene et al. |
| 2016/0277129 A1 | 9/2016 | Manssen |
| 2016/0322991 A1 | 11/2016 | McKinzie |
| 2016/0336916 A1 | 11/2016 | Du Toit et al. |
| 2017/0085244 A1 | 3/2017 | Manssen et al. |

(56) References Cited

U.S. PATENT DOCUMENTS

| | | | |
|---|---|---|---|
| 2017/0264322 | A1 | 9/2017 | Greene et al. |
| 2017/0264335 | A1 | 9/2017 | Hoirup et al. |
| 2017/0294712 | A1 | 10/2017 | Greene |
| 2017/0294891 | A1 | 10/2017 | McKinzie, III |

FOREIGN PATENT DOCUMENTS

| | | | |
|---|---|---|---|
| CN | 201765685 U | | 3/2011 |
| CN | 105703797 | | 6/2016 |
| DE | 19614655 | | 10/1997 |
| DE | 10258805 B4 | | 3/2005 |
| DE | 102008050743 | | 4/2010 |
| DE | 102009018648 A1 | | 10/2010 |
| EP | 0685936 | | 6/1995 |
| EP | 0909024 | | 4/1999 |
| EP | 1079296 | | 2/2001 |
| EP | 1137192 | | 9/2001 |
| EP | 1298810 | | 4/2006 |
| EP | 2214085 A2 | | 8/2010 |
| EP | 2328233 | | 6/2011 |
| EP | 2388925 A1 | | 11/2011 |
| EP | 2424119 A1 | | 2/2012 |
| EP | 2638640 A4 | | 7/2014 |
| EP | 3131157 | | 2/2017 |
| JP | 03276901 | | 3/1990 |
| JP | 02-077580 | | 9/1991 |
| JP | 9321526 | | 12/1997 |
| JP | 10209722 | | 8/1998 |
| JP | 2000124066 | | 4/2000 |
| JP | 2005-130441 | | 5/2005 |
| KR | 100645526 | | 11/2006 |
| KR | 10-0740177 | | 7/2007 |
| WO | 2001/071846 | | 9/2001 |
| WO | 2006/031170 | | 3/2006 |
| WO | 2008/030165 | | 3/2008 |
| WO | 2009/064968 | | 5/2009 |
| WO | 2009/108391 A1 | | 9/2009 |
| WO | 2009/155966 | | 12/2009 |
| WO | 2010028521 A1 | | 3/2010 |
| WO | 2010121914 A1 | | 10/2010 |
| WO | 2011/044592 | | 4/2011 |
| WO | 2011/084716 | | 7/2011 |
| WO | 2011084716 A1 | | 7/2011 |
| WO | 2011102143 A1 | | 8/2011 |
| WO | 2011/133657 | | 10/2011 |
| WO | 2011028453 | | 10/2011 |
| WO | 2012/067622 | | 5/2012 |
| WO | 2012/085932 | | 6/2012 |
| WO | 2012085932 A2 | | 6/2012 |

OTHER PUBLICATIONS

Canadian IPO, "Office Action dated Mar. 10, 2017", Mar. 10, 2017, 1-3.
EPO, "Extended European Search Report, EP16188956.3,", dated Jan. 9, 2017, 1-9.
Extended European Search Report for 12749235.3 dated Jun. 8, 2017.
"European Search Report", 16151299.1 search report, dated 2016.
"Extended European Search Report", EP Application No. 16155235.1, dated May 3, 2016.
"Office Action Received in China Patent Application 201080045689.X", dated Mar. 4, 2016, 6 pages.
"Search Report", ROC (Taiwan) Patent Application No. 101117467, English Translation, dated Apr. 12, 2016, 1 page.
Bezooijen, A. et al., "A GSM/EDGE/WCDMA Adaptive Series—LC Matching Network Using RF-MEMS Switches", IEEE Journal of Solid-State Circuits, vol. 43, No. 10, Oct. 2008, 2259-2268.
Du Toit, "Tunable Microwave Devices With Auto Adjusting Matching Circuit", U.S. Appl. No. 13/302,617, filed Nov. 22, 2011.
Du Toit, "Tunable Microwave Devices With Auto-Adjusting Matching Circuit", U.S. Appl. No. 13/302,649, filed Nov. 22, 2011.
Eiji, N., "High-Frequency Circuit and Its Manufacture", Patent Abstracts of Japan, vol. 1998, No. 13, Nov. 30, 1998 & JP 10 209722 A (Seiko Epson Corp), Aug. 7, 1998.
Greene, "Method and Apparatus for Tuning a Communication Device", U.S. Appl. No. 13/108,463, filed May 16, 2011.
Greene, "Method and Apparatus for Tuning a Communication Device", U.S. Appl. No. 13/108,589, filed May 16, 2011.
Hoirup, "Method and Apparatus for Radio Antenna Frequency Tuning", U.S. Appl. No. 13/030,177, filed Feb. 18, 2011.
Huang, Libo et al., "Theoretical and experimental investigation of adaptive antenna impedance matching for multiband mobile phone applications", IEEE, Sep. 7, 2005, 13-17.
Hyun, S., "Effects of strain on the dielectric properties of tunable dielectric SrTi03 thin films", Applied Physics Letters, vol. 79, No. 2, Jul. 9, 2001.
Ida, I. et al., "An Adaptive Impedance Matching System and Its Application to Mobile Antennas", TENCON 2004, IEEE Region 10 Conference, See Abstract ad p. 544, Nov. 21-24, 2004, 543-547.
Katsuya, K., "Hybrid Integrated Circuit Device", Patent Abstracts of Japan, Publication No. 03-276901, Date of publication of application: Sep. 12, 1991.
Manssen, "Method and Apparatus for Managing Interference in a Communication Device", U.S. Appl. No. 61/326,206, filed Apr. 20, 2010.
Manssen, "Method and Apparatus for Tuning Antennas in a Communication Device", U.S. Appl. No. 12/941,972, filed Nov. 8, 2010.
Manssen, "Method and Apparatus for Tuning Antennas in a Communication Device", U.S. Appl. No. 13/005,122, filed Jan. 12, 2011.
McKinzie, "Adaptive Impedance Matching Module (AIMM) Control Architectures", U.S. Appl. No. 13/293,544, filed Nov. 10, 2011.
McKinzie, "Adaptive Impedance Matching Module (AIMM) Control Architectures", U.S. Appl. No. 13/293,550, filed Nov. 10, 2011.
McKinzie, "Method and Apparatus for Adaptive Impedance Matching", U.S. Appl. No. 13/217,748, filed Aug. 25, 2011.
Mendolia, "Method and Apparatus for Tuning a Communication Device", U.S. Appl. No. 13/035,417, filed Feb. 25, 2011.
Paratek Microwave, Inc., "Method and Appartus for Tuning Antennas in a Communication Device", International Application No. PCT/US11/59620; Filed Nov. 7, 2011.
Patent Cooperation Treaty, "International Search Report and Written Opinion", International Application No. PCT/US2010/046241, dated Mar. 2, 2011.
Patent Cooperation Treaty, "International Search Report and Written Opinion", International Application No. PCT/US2010/056413, dated Jul. 27, 2011.
Patent Cooperation Treaty, "International Search Report and Written Opinion", dated Nov. 16, 2011, International Application No. PCT/US/2011/038543.
Patent Cooperation Treaty, , "International Search Report and Written Opinion", PCT Application No. PCT/US08/005085, dated Jul. 2, 2008.
Payandehjoo, Kasra et al., "Investigation of Parasitic Elements for Coupling Reduction in MultiAntenna Hand-Set Devices", Published online Jan. 22, 2013 in Wiley Online Library (wileyonlinelibrary.com).
Pervez, N.K., "High Tunability barium strontium titanate thin films for RF circuit applications", Applied Physics Letters, vol. 85, No. 19, Nov. 8, 2004.
Petit, Laurent , "MEMS-Switched Parasitic-Antenna Array for Radiation Pattern Diversity", IEEE Transactions on Antennas and Propagation, vol. 54, No. 9, Sep. 2009, 2624-2631.
Qiao, et al., "Antenna Impedance Mismatch Measurement and Correction for Adaptive COMA Transceivers", IEEE, Jan. 2005.
Qiao, et al., "Measurement of Antenna Load Impedance for Power Amplifiers", The Department of Electrical and Computer Engineering, University of California, San Diego, Sep. 13, 2004.
Spears, "Methods for Tuning an Adaptive Impedance Matching Network With a Look-Up Table", U.S. Appl. No. 13/297,951, filed Nov. 16, 2011.
Stemmer, Susanne, "Low-loss tunable capacitors fabricated directly on gold bottom electrodes", Applied Physics Letters 88, 112905, Mar. 15, 2006.

(56) References Cited

OTHER PUBLICATIONS

Taylor, T.R., "Impact of thermal strain on the dielectric constant of sputtered barium strontium titanate thin films", Applied Physics Letters, vol. 80, No. 11, Mar. 18, 2002.
Tombak, Ali, "Tunable Barium Strontium Titanate Thin Film Capacitors for RF and Microwave Applications", IEEE Microwave and Wireles Components Letters, vol. 12, Jan. 2002.
Xu, Hongtao, "Tunable Microwave Integrated Circuits using BST Thin Film Capacitors with Device", Integrated Ferroelectrics, Department of Electrical Engineering and Computer Engineering, University of California, 2005, Apr. 2005.
Zuo, S., "Eigenmode Decoupling for Mimo Loop-Antenna Based on 180 Coupler", Progress in Electromagnetics Research Letters, vol. 26, Aug. 2011, 11-20.
Communication pursuant to Article 94(3) EPC issued by the European Patent Office, dated Nov. 16, 2017. European Patent Application 12177197.6.
Communication pursuant to Article 94(3) EPC, Application No. 10822849.5, dated Oct. 11, 2017, 5 pages.

\* cited by examiner

900

1500

1900

METHOD AND APPARATUS FOR MANAGING INTERFERENCE IN A COMMUNICATION DEVICE

CROSS-REFERENCE TO RELATED APPLICATIONS

This application is a continuation of U.S. patent application Ser. No. 14/483,911, filed Sep. 11, 2014, which is a continuation of U.S. patent application Ser. No. 13/090,583, filed Apr. 20, 2011 (now U.S. Pat. No. 8,860,526), which claims priority to U.S. Provisional Application Ser. No. 61/326,206 filed on Apr. 20, 2010, the disclosures of which are hereby incorporated by reference in their entirety. This Application is also related to U.S. application Ser. No. 13/090,575 entitled "Method and Apparatus for Managing Interference in a Communication Device" filed Apr. 20, 2011, the disclosure of which is hereby incorporated by reference in its entirety.

FIELD OF THE DISCLOSURE

The present disclosure relates generally to communication device operations, and more specifically to a method and apparatus for managing interference in a communication device.

BACKGROUND

The quality of wireless communications between wireless access points such as Wireless Fidelity (WiFi) or cellular base stations and portable mobile devices such as cell phones and laptop computers can depend on many factors. For example, an antenna's performance in a portable device can be impacted by its operating environment. Multiple use cases can exist for radio handsets, which include such conditions as the placement of the handset's antenna next to a user's head, or in the user's pocket or the covering of an antenna with a hand, which can significantly impair wireless device efficiency. Similarly, the quality of wireless communications can be affected by network topology and location of the mobile device.

DETAILED DESCRIPTION

Figure 1:
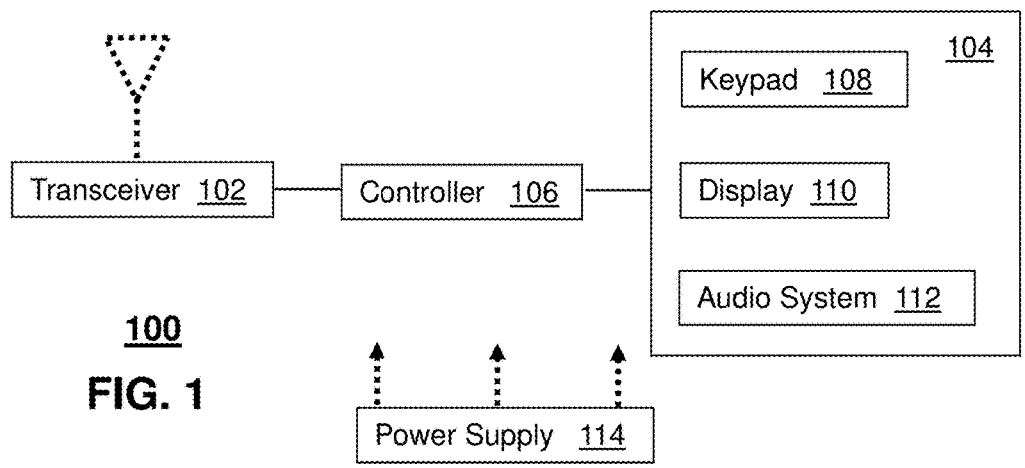
FIG. 1 depicts an illustrative embodiment of a communication device.

One embodiment of the present disclosure entails a computer-readable storage medium comprising computer instructions to detect an existence of an interferer and determine a tuning state of a matching network having a tunable reactance, where the determination of the tuning state is based on whether the interferer exists and is based on information from at least one of an open-loop or closed-loop feedback configuration.

One embodiment of the present disclosure entails a matching network, comprising: a tunable reactance circuit configured to be coupled to at least one of a transmitter portion and a receiver portion of a communication device, wherein the tunable reactance circuit is adjustable to a plurality of tuning states, and wherein the determination of a tuning state is based on whether an interferer exists and is based on information from at least one of an open-loop or closed-loop feedback configuration of the tunable reactance circuit.

One embodiment of the present disclosure entails a method comprising detecting interference with a communication device based on an existence of an interferer and determining a tuning state of a variable matching network of the communication device based on whether the interferer exists.

One embodiment of the present disclosure entails a communication device comprising a controller to determine a tuning state of a variable matching network that controls one or more operational characteristics of one of a receiver portion and a transmitter portion of the communication device, where the controller is operable to detect an existence of an interferer and determine the tuning state based on whether the interferer exists and based on information from at least one of an open-loop or closed-loop feedback configuration.

One embodiment of the present disclosure entails a method comprising detecting an existence of an interferer that is interfering with a communication device; determining a tuning state of a variable matching network of the communication device based on whether the interferer exists; and adjusting the variable matching network based on the determined tuning state only when the existence of the interferer is not detected.

One embodiment of the present disclosure entails a method comprising detecting interference with a communication device sourced by an interferer; and determining a tuning state of a variable matching network of the communication device based on the detected interference.

One embodiment of the present disclosure entails a method comprising determining parameters of interference with a communication device, the interference being sourced by an interferer; and adjusting a tuning state of a variable matching network of the communication device based on the interference parameters.

One embodiment of the present disclosure entails a matching network comprising a tunable reactance circuit configured to be coupled to at least one of a transmitter portion and a receiver portion of a communication device, wherein the tunable reactance circuit is adjustable to a plurality of tuning states, and wherein the determination of a tuning state is based on parameters associated with a detected interference.

One embodiment of the present disclosure entails a non-transitory computer-readable storage medium comprising computer instructions to determine interference with a communication device; and adjust a tuning state of a variable matching network of the communication device based on parameters associated with the interference.

FIG. 1 depicts an exemplary embodiment of a communication device 100. The communication device 100 can comprise a wireless transceiver 102 (herein having independent transmit and receiver sections, a user interface (UI) 104, a power supply 114, and a controller 106 for managing operations thereof. The wireless transceiver 102 can utilize short-range or long-range wireless access technologies such as Bluetooth, WiFi, Digital Enhanced Cordless Telecommunications (DECT), or cellular communication technologies, just to mention a few. Cellular technologies can include, for example, CDMA-1x, WCDMA, UMTS/HSDPA, GSM/GPRS, TDMA/EDGE, EV/DO, WiMAX, and next generation cellular wireless communication technologies as they arise.

The UI 104 can include a depressible or touch-sensitive keypad 108 with a navigation mechanism such as a roller ball, joystick, mouse, or navigation disk for manipulating operations of the communication device 100. The keypad 108 can be an integral part of a housing assembly of the communication device 100 or an independent device operably coupled thereto by a tethered wireline interface (such as a flex cable) or a wireless interface supporting for example Bluetooth. The keypad 108 can represent a numeric dialing keypad commonly used by phones, and/or a Qwerty keypad with alphanumeric keys. The UI 104 can further include a display 110 such as monochrome or color LCD (Liquid Crystal Display), OLED (Organic Light Emitting Diode) or other suitable display technology for conveying images to an end user of the communication device 100. In an embodiment where the display 110 is a touch-sensitive display, a portion or all of the keypad 108 can be presented by way of the display.

The power supply 114 can utilize common power management technologies (such as replaceable batteries, supply regulation technologies, and charging system technologies) for supplying energy to the components of the communication device 100 to facilitate portable applications. The controller 106 can utilize computing technologies such as a microprocessor and/or digital signal processor (DSP) with associated storage memory such a Flash, ROM, RAM, SRAM, DRAM or other like technologies.

Figure 2:
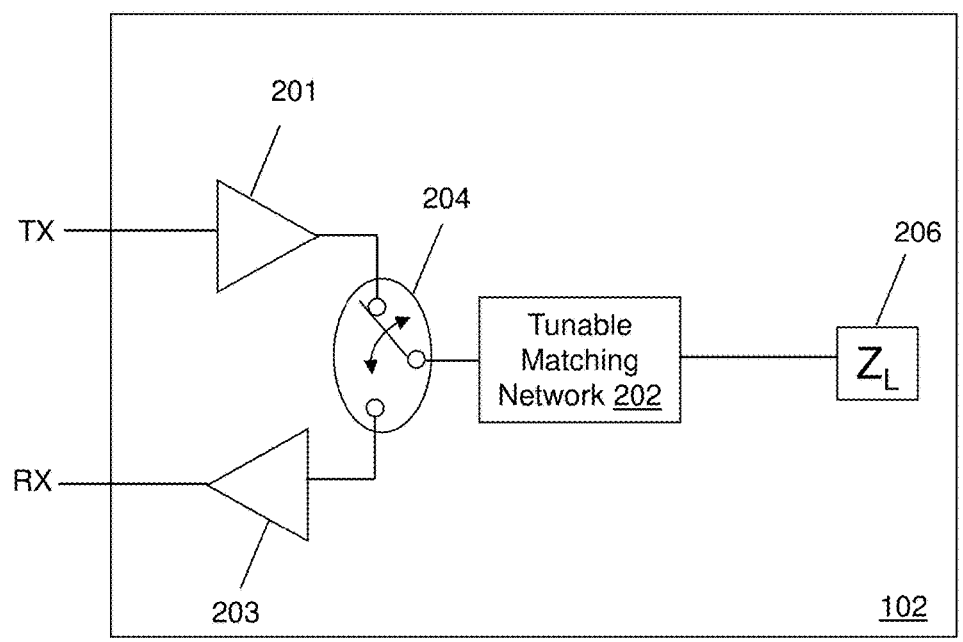
FIG. 2 depicts an illustrative embodiment of a portion of a transceiver of the communication device of FIG. 1.

FIG. 2 depicts an illustrative embodiment of a portion of the wireless transceiver 102 of the communication device 100 of FIG. 1. In GSM applications, the transmit and receive portions of the transceiver 102 can include common amplifiers 201, 203 coupled to a tunable matching network 202 and an impedance load 206 by way of a switch 204. The load 206 in the present illustration can be an antenna as shown in FIG. 1 (herein antenna 206). A transmit signal in the form of a radio frequency (RF) signal (TX) can be directed to the amplifier 201 which amplifies the signal and directs the amplified signal to the antenna 206 by way of the tunable matching network 202 when switch 204 is enabled for a transmission session. The receive portion of the transceiver 102 can utilize a pre-amplifier 203 which amplifies signals received from the antenna 206 by way of the tunable matching network 202 when switch 204 is enabled for a receive session. Other configurations of FIG. 2 are possible for other types of cellular access technologies such as CDMA. These undisclosed configurations are contemplated by the present disclosure.

Figure 3:
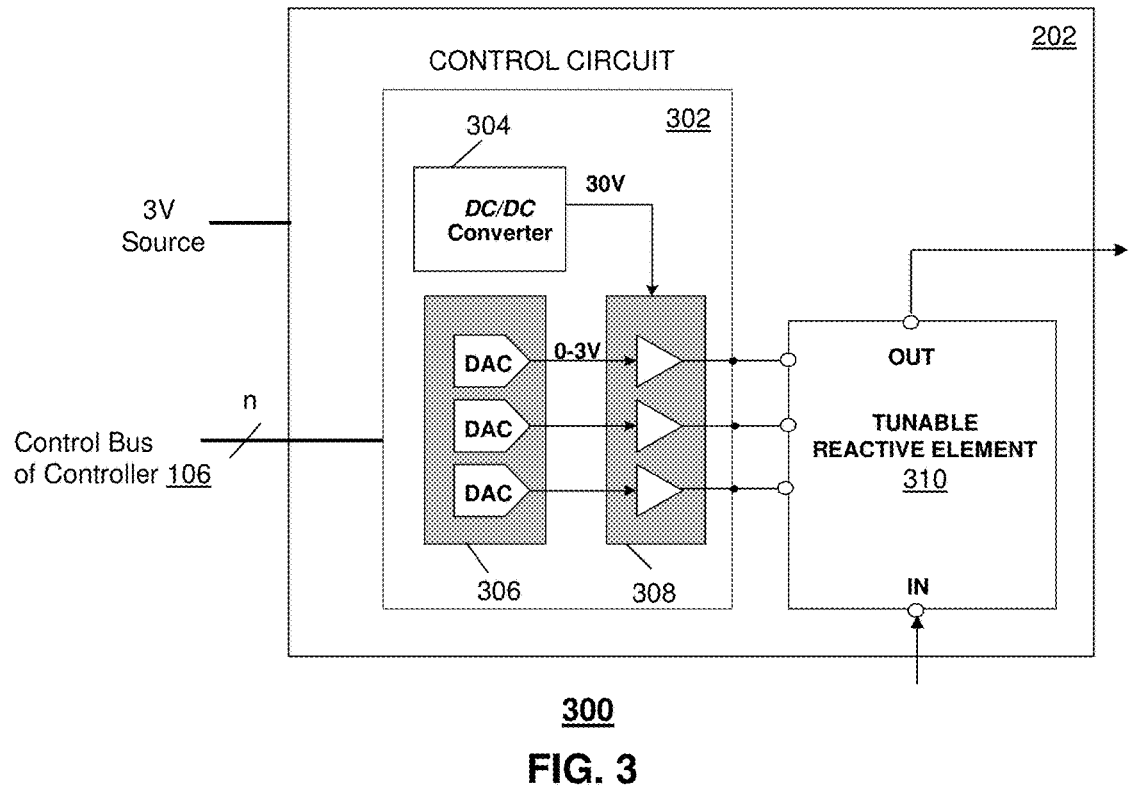
FIGS. 3-4 depict illustrative embodiments of a tunable matching network of the transceiver of FIG. 2.
Figure 4:
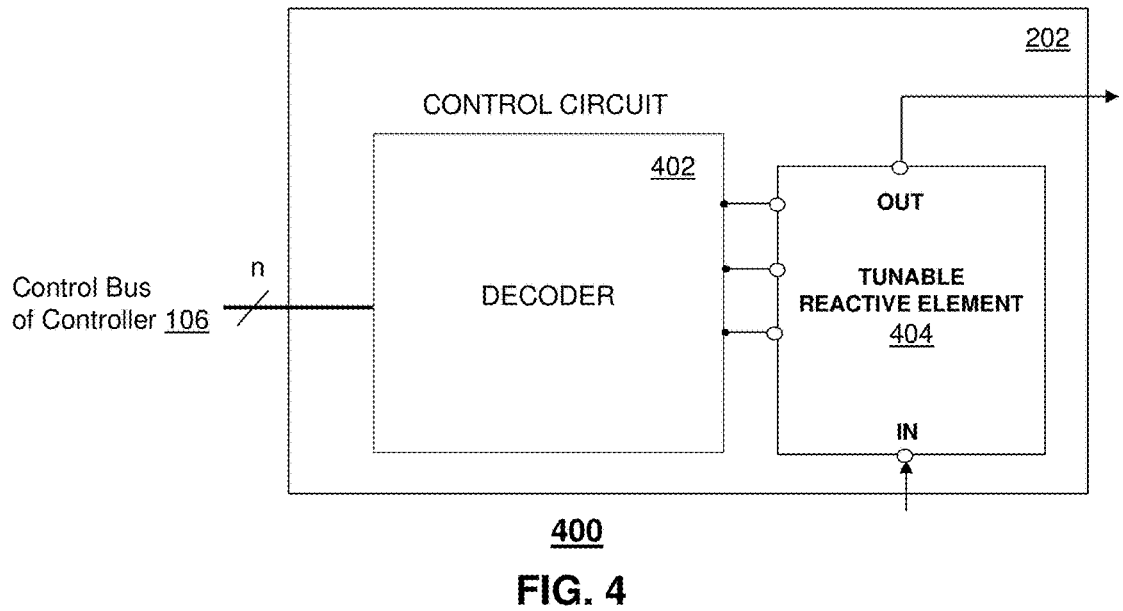
Figure 5:
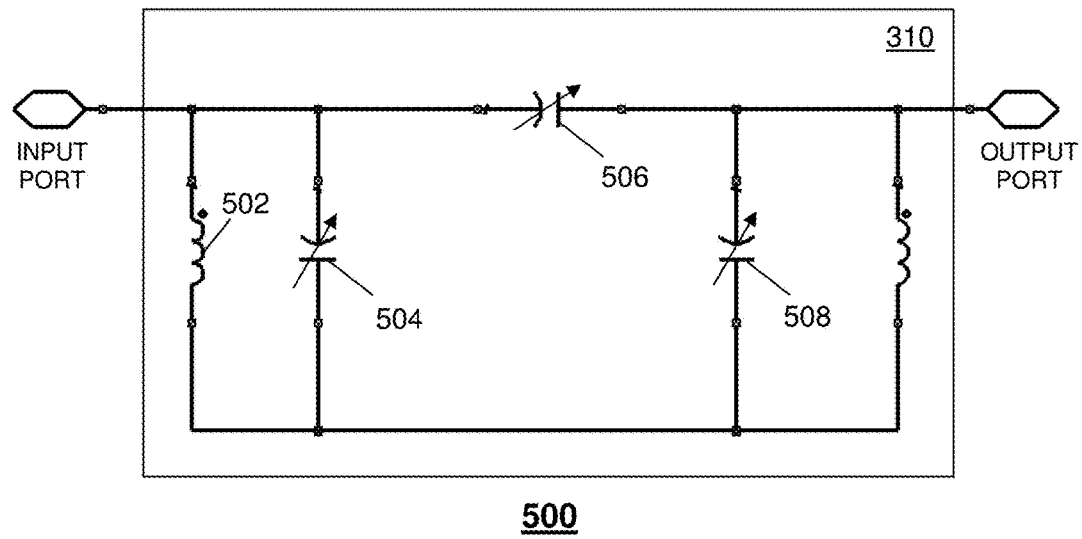
FIGS. 5-6 depict illustrative embodiments of a tunable reactive element of the tunable matching network.

FIGS. 3-4 depict illustrative embodiments of the tunable matching network 202 of the transceiver 102 of FIG. 2. In one embodiment, the tunable matching network 202 can comprise a control circuit 302 and a tunable reactive element 310. The control circuit 302 can comprise a DC-to-DC converter 304, one or more digital to analog converters (DACs) 306 and one or more corresponding buffers 308 to amplify the voltage generated by each DAC. The amplified signal can be fed to one or more tunable reactive components 504, 506 and 508 such as shown in FIG. 5, which depicts a possible circuit configuration for the tunable reactive element 310. In this illustration, the tunable reactive element 310 includes three tunable capacitors 504-508 and an inductor 502 with a fixed inductance. Other circuit configurations are possible, and thereby contemplated by the present disclosure.

The tunable capacitors 504-508 can each utilize technology that enables tunability of the capacitance of said component. One embodiment of the tunable capacitors 504-508 can utilize voltage or current tunable dielectric materials such as a composition of barium strontium titanate (BST). An illustration of a BST composition is the Parascan® Tunable Capacitor. In another embodiment, the tunable reactive element 310 can utilize semiconductor varactors. Other present or next generation methods or material compositions that can support a means for a voltage or current tunable reactive element are contemplated by the present disclosure.

The DC-to-DC converter 304 can receive a power signal such as 3 Volts from the power supply 114 of the communication device 100 in FIG. 1. The DC-to-DC converter 304 can use common technology to amplify this power signal to a higher range (e.g., 30 Volts) such as shown. The controller 106 can supply digital signals to each of the DACs 306 by way of a control bus of "n" or more wires to individually control the capacitance of tunable capacitors 504-508, thereby varying the collective reactance of the tunable matching network 202. The control bus can be implemented with a two-wire common serial communications technology such as a Serial Peripheral Interface (SPI) bus. With an SPI bus, the controller 106 can submit serialized digital signals to configure each DAC in FIG. 3 or the switches of the tunable reactive element 404 of FIG. 4. The control circuit 302 of FIG. 3 can utilize common digital logic to implement the SPI bus and to direct digital signals supplied by the controller 106 to the DACs.

Figure 6:
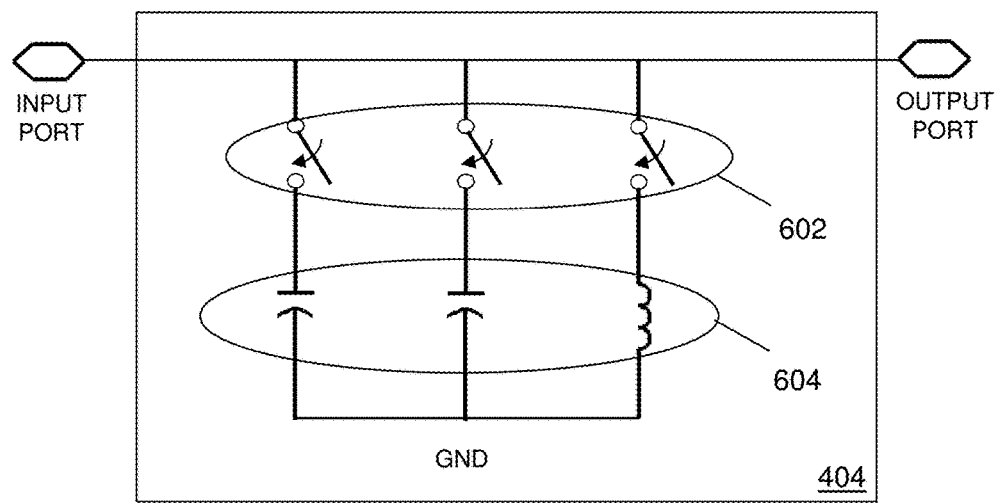

In another embodiment, the tunable matching network 202 can comprise a control circuit 402 in the form of a decoder and a tunable reactive element 404 comprising switchable reactive elements such as shown in FIG. 6. In this embodiment, the controller 106 can supply the control circuit 402 signals via the SPI bus which can be decoded with common Boolean or state machine logic to individually enable or disable the switching elements 602. The switching elements 602 can be implemented with semiconductor switches or micro-machined switches such as utilized in micro-electromechanical systems (MEMS). By independently enabling and disabling the reactive elements (capacitor or inductor) of FIG. 6 with the switching elements 602, the collective reactance of the tunable reactive element 404 can be varied.

The tunability of the tunable matching networks 202, 204 provides the controller 106 a means to optimize performance parameters of the transceiver 102 such as, for example, but not limited to, transmitter power, transmitter efficiency, receiver sensitivity, power consumption of the communication device, a specific absorption rate (SAR) of energy by a human body, frequency band performance parameters, and so on.

To achieve one or more desirable performance characteristics which a designer can define, the communication device 100 can be placed in an anechoic chamber. In this configuration, the designer can perform calibration measurements of performance parameters of the communication device 100 such as Total Radiated Power (TRP), Total Isotropic Sensitivity (TIS) or Radiated Harmonics measurements, receiver efficiency, transmit power efficiency, and power consumption, just to mention a few. For a multi-frequency band communication device 100, the calibration measurements can be performed per band or per sub-band.

Additionally, the calibration measurements can be performed under a number of use cases of the communication device 100 utilizing a phantom body that emulates the composition of a human body. For instance, a communication device 100 having a housing assembly of a flip design, the communication device 100 can be placed next to an ear of the phantom when the flip is open to emulate a typical conversational use case. In a hands-free application such when a user utilizes a Bluetooth headset or when the communication device 100 is in standby mode, the communication device 100 can be placed on a hip of the phantom with the flip closed. Calibration can be performed on other use cases such as antenna up, or down, speakerphone feature "ON" with communication device 100 held with a phantom hand but away from the phantom head. Any number of use cases can be applied to each frequency band and sub-band if desirable.

Figure 7:
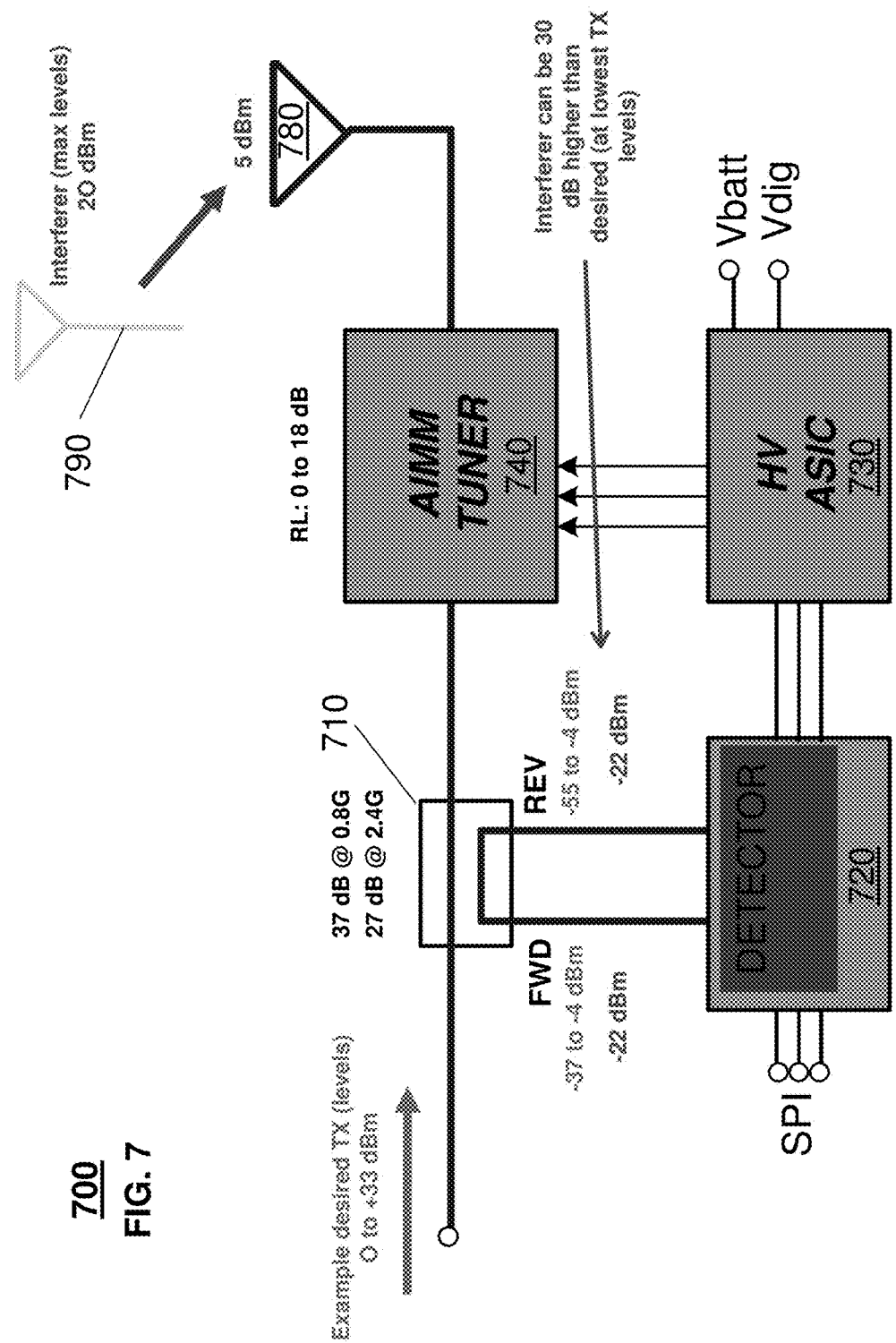
FIGS. 7-8 depict illustrative embodiments of portions of communication devices with tunable matching networks.

FIG. 7 depicts an exemplary embodiment of a portion of a communication device 700 (such as device 100 in FIG. 1) having a tunable matching network which can include a number of components such as a directional coupler 710, a detector(s) 720, a High Voltage Application Specific Integrated Circuit (HVASIC) 730 and a tuner 740 (such as an Adaptive Impedance Matching Module (AIMM) tuner)). The tunable matching network can include various other components in addition to or in place of the components shown, including components described above with respect to FIGS. 1-6. The tunable matching network can be coupled to an antenna 780 and a transceiver (or transmitter and/or receiver) for facilitating communication of signals between the communication device and another device or system. In this exemplary embodiment, the communication device 700 is in proximity to an interferer 790 which is interfering with the transmission and reception of signals by the device. Various RF levels are depicted which include a desired range for the transmission level of 0 to +33 dBm. The present disclosure contemplates other RF levels being utilized or encountered. As can be seen, the introduction of the interferer 790 can result in undesired tuning of the device 700.

Figure 8:
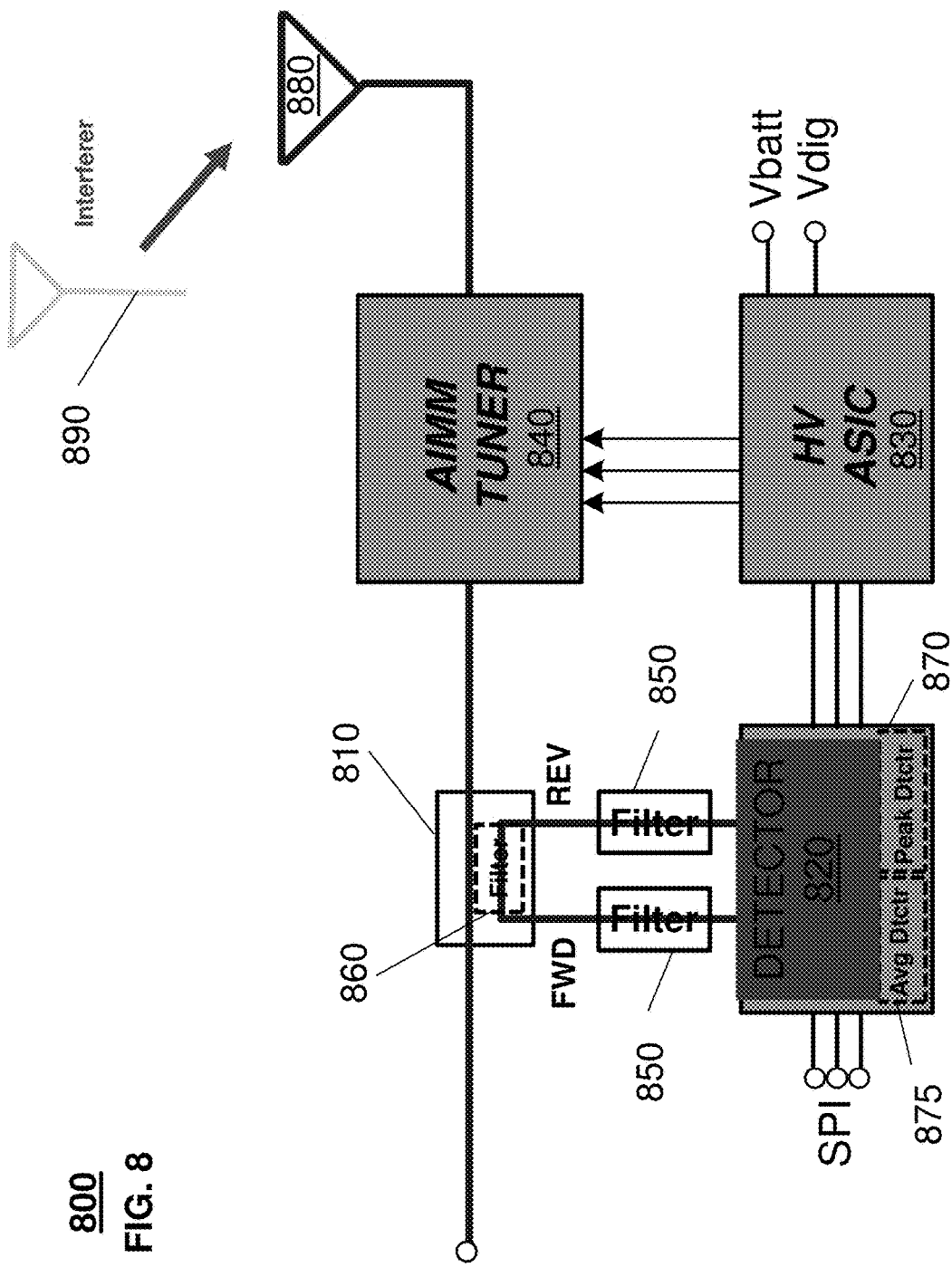
Figure 9:
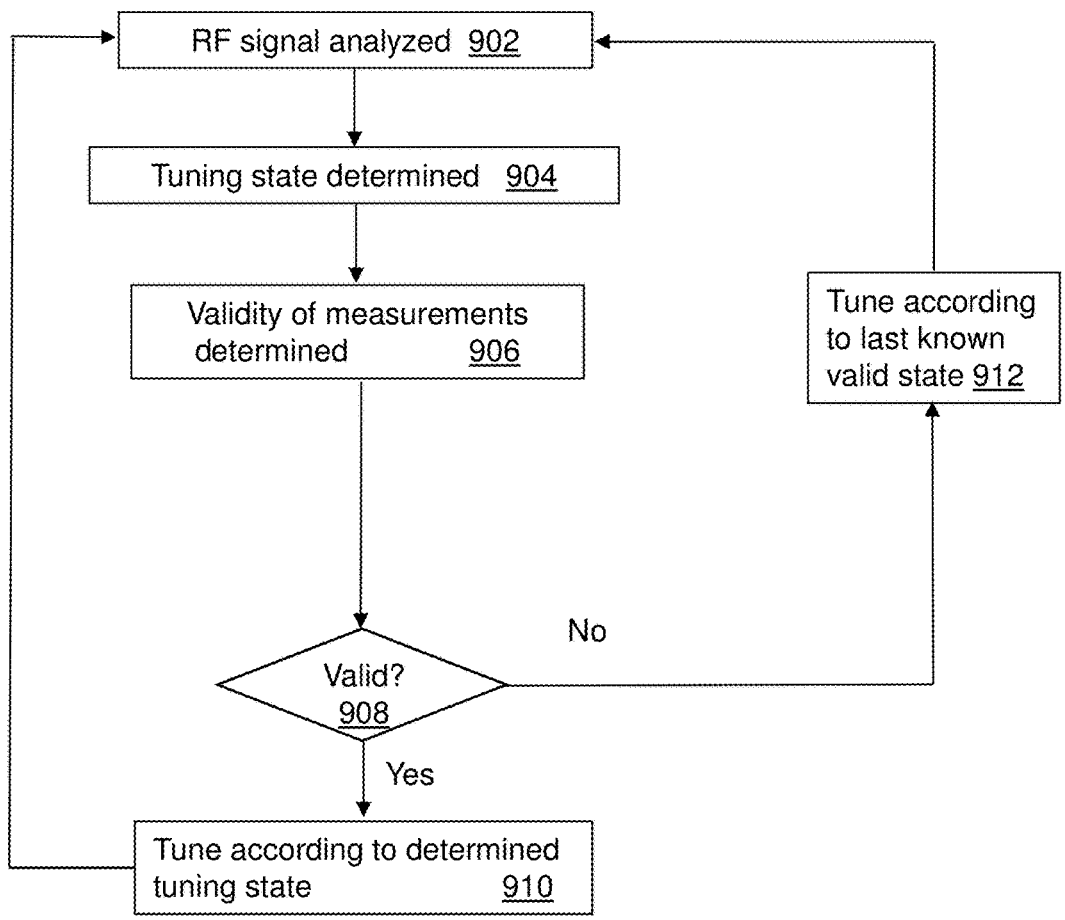
FIG. 9 depicts a method operating in portions of the communication device of FIGS. 7-8.

FIG. 8 depicts an exemplary embodiment of a portion of a communication device 800 (such as device 100 in FIG. 1) having a tunable matching network which can include a number of components such as a coupler 810, a detector(s) 820, a High Voltage Application Specific Integrated Circuit (HVASIC) 830 and a tuner 840 (such as an Adaptive Impedance Matching Module (AIMM) tuner). The tunable matching network can include various other components in addition to or in place of the components shown, including components described above with respect to FIGS. 1-6. The tunable matching network can be coupled to an antenna 880 and a transceiver (or transmitter and/or receiver) for facilitating communication of signals between the communication device and another device or system. In this exemplary embodiment, the communication device 800 is in proximity to an interferer 890 which is disrupting the tuner control loop, such as the measurement of the antenna VSWR by the device.

Device 800 can include one or more components that allow for the detection of the interferer and an adjustment to the tuning technique based on the interferer detection. For instance, in one exemplary embodiment, the AIMM algorithm can act as a look-up table of tuning states but subject to updating the tuning state when valid measurements can be made. When a measurement is determined to be invalid, then the device can utilize the last known valid tuning state for the particular use case. Other adjustments to the tuning technique can also be utilized. For instance, the tuning can be delayed, such as for a predetermined period of time, until a valid measurement can be made. In another embodiment, if a valid measurement cannot be made within the predetermined time period then the last known valid tuning state for the particular use case can be utilized for tuning.

In one embodiment, isolation between antennas inside the device 800 can be maintained in order to reduce the power of internally generated interferers (such as WiFi and Bluetooth) that are detected at the coupler outputs. The particular level of isolation that is utilized can vary. Examples of multiple antenna systems in communication devices, such as diversity antenna systems, are described in U.S. patent application Ser. No. 13/005,122 filed on Jan. 12, 2011, the disclosure of which is hereby incorporated by reference in its entirety.

In another embodiment, one or more filters 850 can be coupled to the coupler 810. The particular type of filter can vary and can include BT/WiFi elimination filters or BP filters. For example, these filters can be band rejection or band "suckout" circuits. The filter can be a single filter coupled to the reflection output of the coupler 810, but the present disclosure contemplates filters coupled to both outputs of the coupler. In one embodiment, 2.4 GHz elimination filters can be coupled to the output ports of the directional coupler, although other filter ranges can also be utilized.

In one embodiment, a filter 860 (such as a BP filter) can be incorporated into the coupler 810. For instance, since couplers can be built in a multi-layer dielectric structure, filter elements can be incorporated into the structure to deploy the types of band reject or elimination filters desired.

While the previous embodiments have described the use of a directional coupler to detect the VSWR or impedance of the tunable matching network as the source of feedback for the algorithm controlling the tunable network, there are other possible components, techniques and/or means to determine the impedance of the network, or to supply inputs to an algorithm designed to tune the tunable matching network. Known methods for determining impedance matching can also be utilized with the exemplary embodiments described herein. It should be noted that the techniques to avoid and mitigate interfering signals described herein can be applied to other means of determining feedback for the control algorithm.

In another embodiment, a peak detector 870 and an average detector 875 can be coupled to or included within the sensor IC 820 to determine the presence of amplitude modulation such as through comparing forward to reverse output data on constant envelope signals. In one embodiment, the peak and average measurements on the difference between the forward and reverse signals can ignore the transmitter's intentional modulation but detect amplitude modulation from the beat note which is generated by the combination of the desired and interfering signals being present simultaneously.

The exemplary embodiments described herein allow a communication device to mitigate the effects of an interferer that is generating interference that is affecting the communication device. In one embodiment, the device can implement a multi-thread antenna tuning algorithm. For instance, an open loop look-up table can operate to store the nominal tuning state for each band, sub-band, mechanical position, speaker state, etc. (use cases). When transmitting, the algorithm can run to determine if a better tuning state can be found, and can continuously improve it. The tuning state in the look up table can be replaced as the algorithm finds better tuning states for the particular use case in operation. Each Return Loss (RL) or impedance measurement can be checked for validity before the algorithm is allowed to update the tuning state. If an RL measurement is deemed invalid (such as for a single iteration) then the tuner state may not be changed.

Method 900 can begin with step 902 in which an RF signal is analyzed in order to perform impedance matching using one or more of the components and/or systems described above, including the AIMM tuner 840. In one embodiment, the AIMM algorithm can act as a look-up table of tuning states, which can be updated based on measurements that are determined to be valid. Method 900 can be based on closed-loop and/or open-loop feedback. For instance, the RF signal can be analyzed using closed-loop feedback in combination with open-loop feedback, such as based on stored information that is correlated to a physical state of the device (e.g., in a flipped-open position). The present disclosure also contemplates performing one or more of the steps of method 900 based on only open-loop feedback or based on only closed loop feedback. In step 904, the tuning state can be determined based on the analysis and the feedback described above.

Measurements can then be validated in step 906, such as to detect the existence of an interferer. Validation can be performed in a number of different ways. In one embodiment, a number of return loss phase measurements can be taken over time. A comparison of the maximum to minimum values can be done, and validity can be based on the range being less than a predetermined threshold. For instance, if an interfering signal is present for only some of the measurements, an assumption can be made that the phase of the interfering signal will be different from that of the transmission forward and reflected signals. The timing of the measurements can be long enough such that one burst of a WiFi or other interfering transmission would not be present in all of the measurements, and at least one measurement would fall in between transmission bursts. In another embodiment, the measurements can be processed with respect to the forward and reverse power measurements (amplitude) which are coincident with the phase measurements to determine which are valid and which were made in the presence of an interferer, and ignore only those measurements, while using the valid measurements in the algorithmic computations.

In another embodiment in which the detectors are complete receivers, the forward and reverse demodulated data can be compared to detect interference. For example, complete receivers as detectors in both the forward and received sampled signal paths (such as shown in FIG. 8) can be utilized. These receivers can be tuned specifically to the frequency of the transmitted signal and can thus ignore any interfering signals not on the same frequency or channel. This aspect will eliminate virtually all possible interfering signals in a normal implementation. Also, in this example, the forward and reverse samples should have the same modulation as the desired transmitted signal. If an interferer is present, the receiver may either have the selectivity to ignore the interferer or the received signal may be disrupted and the demodulated data would not match the desired transmitted data. In this latter case, the measurements of forward and reverse power can then be ignored as being invalid.

In one embodiment, multiple fast samples can be taken to detect peaks/nulls that are indicative of interference. For instance, an interfering signal mixing with the desired signals can create a "beat note" in the amplitude. By taking amplitude measurements at very high speeds, method 900 can detect the effective amplitude modulation. If the amplitude modulation exceeds the desired transmitted signal modulation then the measurement can be designated as invalid.

In another embodiment, phase measurements can be analyzed and compared to a threshold for erratic shift (for example applying a 50 ohm exclusion) Phase measurements between non-coherent signals (such as between an interferer and a desired signal) can give random results. Phase measurements between coherent signals (such as the forward and reflected signals) which are close to 50 ohms can also give random results. Phase measurements between coherent signals that are not very close to 50 ohms are relatively stable. If phase signals are erratic (such as change by more than a certain amount between two readings or a standard deviation greater than a certain value or some other method of detecting erratic measurements) then the reflected signal may be an interferer. In one embodiment, the algorithm can be turned off only if both erratic phase is present and the return loss is larger than a certain value (away from 50 ohms).

In another embodiment, sampling can be performed during transmission and when the transmitter is off. For instance, DTX can be used in WCDMA/CDMA to find times when the transmitter is off. In GSM or other Time Division systems, intervals between transmit bursts can be used. A threshold can be compared and applied to a reflected input. If the measured levels during transmission are too close to the levels when the transmitter is off, then the measurement can be deemed invalid. In one embodiment, multiple measurements can be used to detect pulsed interferers.

In one embodiment, an AIMM engagement threshold and Reflection Loss (RL) targets based on detected reflected input (when not transmitting) can be varied. When the transmitter is not active, a measurement of the reflected port can be taken. This measurement can be used to detect an interferer and measure its amplitude. The amplitude of the interferer can be used to set a threshold for the reflected power below which the measurement would be deemed invalid. The interferer level could also be used to adjust the RL target of the algorithm's figure of merit under interferer conditions.

In another embodiment, measurements can be performed both before and after known transmit power level changes and then changes can be compared to predicted change. For instance, the cellular handset controller has knowledge of the power level at which it is transmitting and also the size of any intentional changes to the transmitted power level. To test for the presence of an interferer, the tuning can be kept static and the detected powers/return loss can be measured. If the detected change in power measurements are not within a preset tolerance of the known intentional change, the measurement can be determined to be degraded by an interferer, and measurements can be deemed invalid.

In one embodiment, tuning can be prevented if the RL detected is greater than zero. For instance, if the measured RL is greater than zero (or a predetermined value to allow measurement uncertainty or other variations), then the existence of an interferer has been determined. The predetermined value can further include design knowledge of the tuner and antenna load in a specific application.

If the measurements are determined to be valid then the tuning can be performed as in step 910 to achieve the impedance matching. If on the other hand, the measurements are deemed invalid (such as through the existence of an interferer) then the algorithm can ignore the last inputs and retain the previous tuning state as in step 910. The algorithm can then continue normally and take the next scheduled measurements and again gauge the validity of those measurements. The algorithm can maintain the last known good tuning state until valid measurements allow the algorithm to continue tuning the matching network according to the figure of merit.

Method 900 can apply a number of thresholds in determining the validity of the measurements and detecting the existence of an interferer. For example, the cellular handset controller has knowledge of the power level at which it is transmitting. The AIMM algorithm can be disabled if the known transmit power level is below a predetermined threshold.

Detected levels of interference can be used to set the AIMM on/off control. For example, reflected power measurements that exceed certain thresholds can be invalidated. The thresholds can be dynamic and set as a function of the known transmitted power level, and also as a function of the RL target for the particular channel/use case currently being tuned. As another example, detected level of forward power can be monitored. The cellular handset controller has knowledge of the power level at which it is transmitting. If the forward power detected is in not within a set limit of the desired level, the measurements of both forward and reflected power can be deemed invalid.

In one embodiment, with phase-based tuning algorithms (using impedance targets), predicted RL improvements based on known techniques can be compared to actual measured RL improvements. With RL phase information and a look-up table (LUT) (predetermined open-loop typical tuning state values) or calculations (using known/expected tuner LUT), antenna impedance can be predicted, and correspondingly the tuning state in which to set the tuner can be determined in order to achieve the desired match. After changing the tuning state, if the change in RL/impedance is not within a predetermined threshold of the expected result, then it can be determined that the measurement is being degraded by an interferer, and deemed invalid. The tuner can be restored to its last known good or valid tuning state (such as a default state).

In another embodiment, the tuning range can be limited to increase tuner attenuation at known interferer frequencies.

In typical embodiments there may be additional limitations in the circuitry such as noise thresholds caused by non-coherent signals from within or without a cellular handset or other radio which could affect the validity of detected signals used by an adaptive tuning network. While most of this specification describes the sources of these limitations as interfering signals, this invention is not limited to just the consideration of such signals. The exemplary embodiments can be utilized for tuning of a variable matching network in a communication device based on all types of interference or undesired conditions affecting the communication device. The exemplary embodiments can apply anomaly detection to the tuning algorithm for determining a tuning state.

In one embodiment, a low pass filter can be implemented that eliminates interferers outside of the filter bandwidth. Quadrature mixers can be utilized to avoid cancellation due to in-phase forward and reflection signals. The particular configuration of the components can vary. For instance, a low pass filter and a 90 degree phase shifter can be utilized, and can be incorporated into or otherwise implemented from, the transceiver components. In one embodiment, a VCO can be utilized that is running at twice the frequency and flip-flops can be used for dividing.

Figure 10:
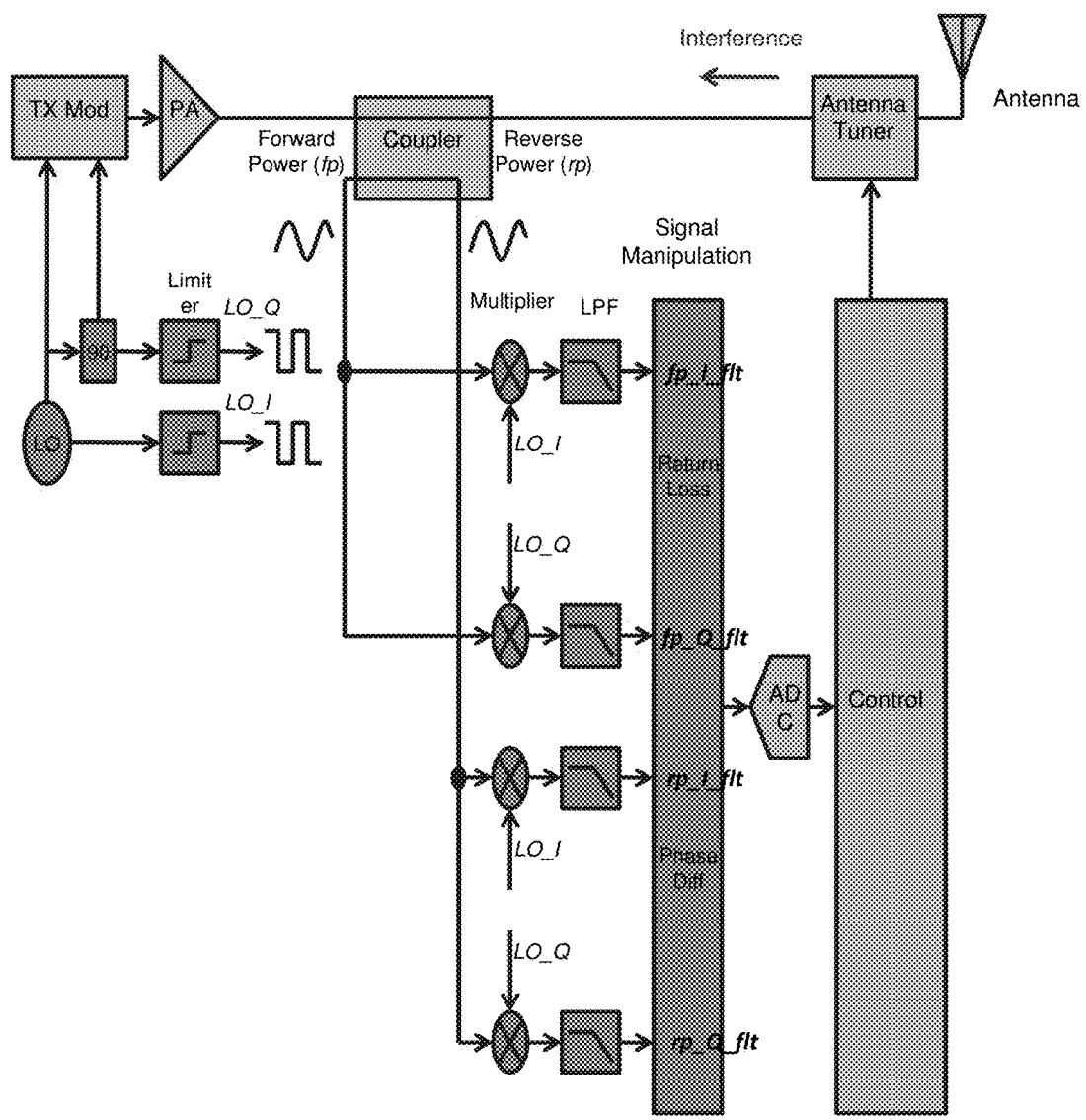
FIG. 10 depicts an illustrative embodiment of a portion of communication devices including a power and phase detector.
Figure 11:
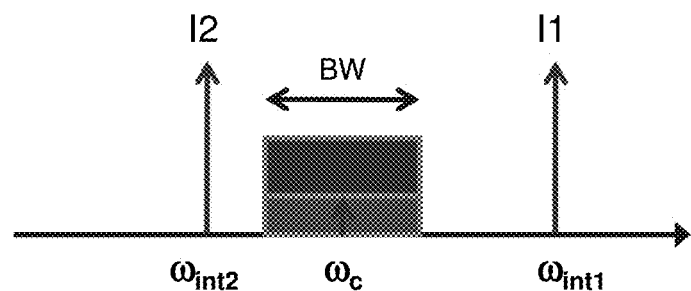
FIG. 11 depicts an illustrative embodiment of a frequency diagram for the communication device of FIG. 10.

In exemplary embodiment 1000 and its corresponding frequency graph 1100, which are shown generally in FIGS. 10 and 11, low pass filters (LPFs) can be utilized to reduce or eliminate all interferers outside the filter bandwidth. The return loss magnitude and/or phase can be obtained by combining fp_I_flt, fp_Q_flt, rp_I_flt, rp_Q_flt in the analog or digital domain. Quadrature mixers can be utilized to avoid cancellation due to RF and LO being in-phase. One or more of the LPFs can be set at values low enough so that AM modulation may be removed.

In one embodiment, the forward signal can be utilized as the LO for the I and Q mixers on the detection IC of embodiment 1000. This eliminates the need for the transceiver IC to provide the LO signal. Another advantage of this method is that the transmit modulation will be present on the LO signal. The modulation envelope can then be eliminated by the mixers. With the modulation eliminated, the baseband lowpass filter can be wider, allowing for a faster measurement than if the LPF had to be set low enough to filter out the modulation. When using the forward signal for the LO, a BPF may be employed to improve performance by attenuating any interferers that may have coupled on to the forward signal.

This exemplary embodiment contemplates use of the same LO as the transmitter or use of a different LO, such as a stand-alone LO (e.g., generated by an IC detector) which can be phase-locked with the transmitter.

Figure 12:
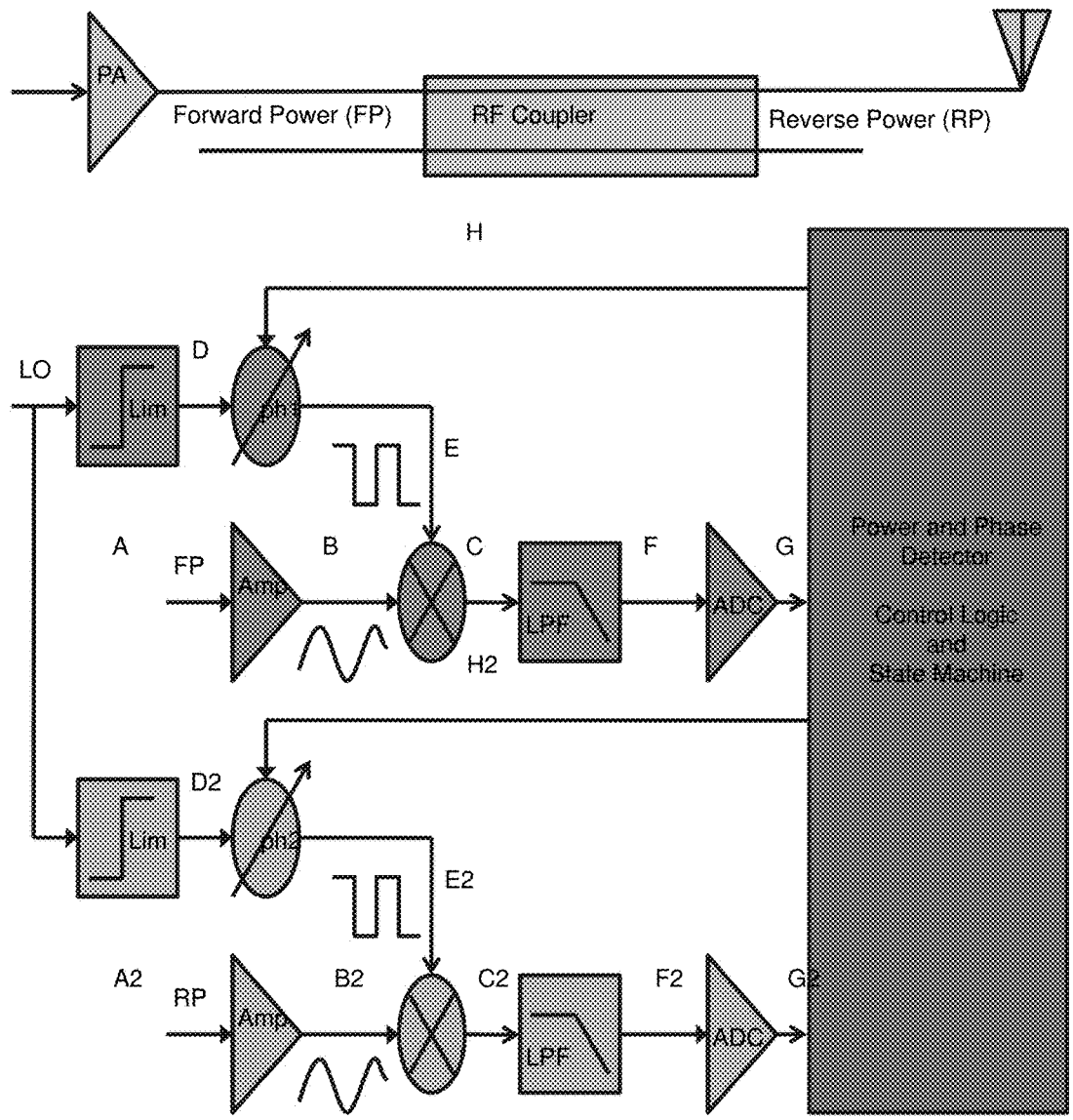
FIGS. 12-16 depict illustrative embodiments of portions of communication devices including power and phase detectors.

In exemplary embodiment 1200 shown generally in FIG. 12, low pass filter(s) (LPFs) can be utilized in combination with power and phase detectors and other control logic for tuning and filtering out interference. In one embodiment, ph1 can be swept to maximize node G while ph2 is swept to maximize node G2. Other components can be utilized with embodiment 1200, such as an amplitude detector and/or a phase modulator. The RL and phase can be computed.

Figure 13:
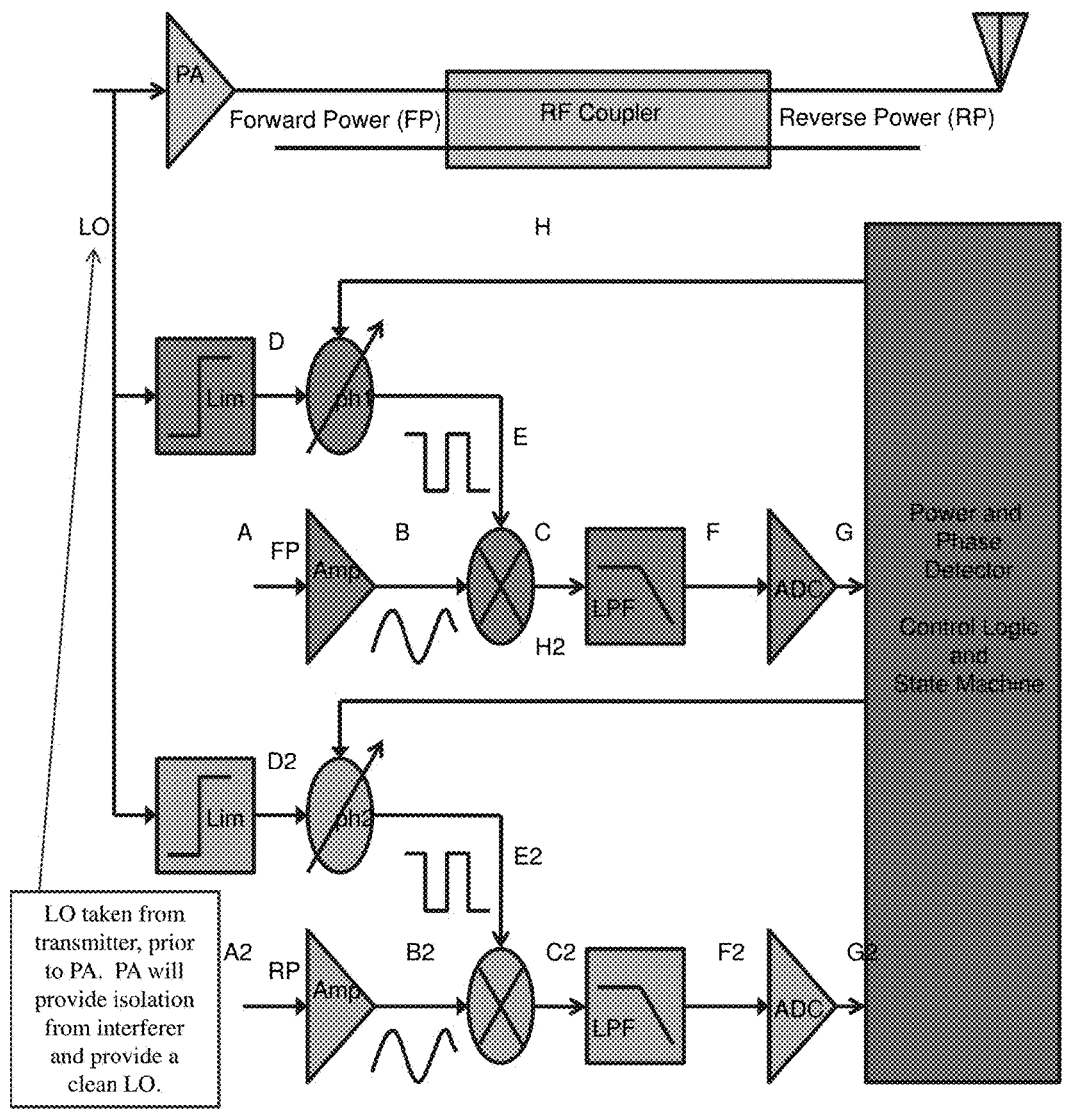

In another exemplary embodiment 1300 shown generally in FIG. 13, the sweeping and computation described with respect to FIG. 12 can be performed. The LO can be taken from the transmitter, prior to power amplification (PA). For instance, the LO can be obtained from the input to the PA, which may be more accessible to the tuning components. The PA can provide isolation from any interferer and provide a clean LO. The limiter can be utilized to strip away the envelope of the amplitude modulation.

Figure 14:
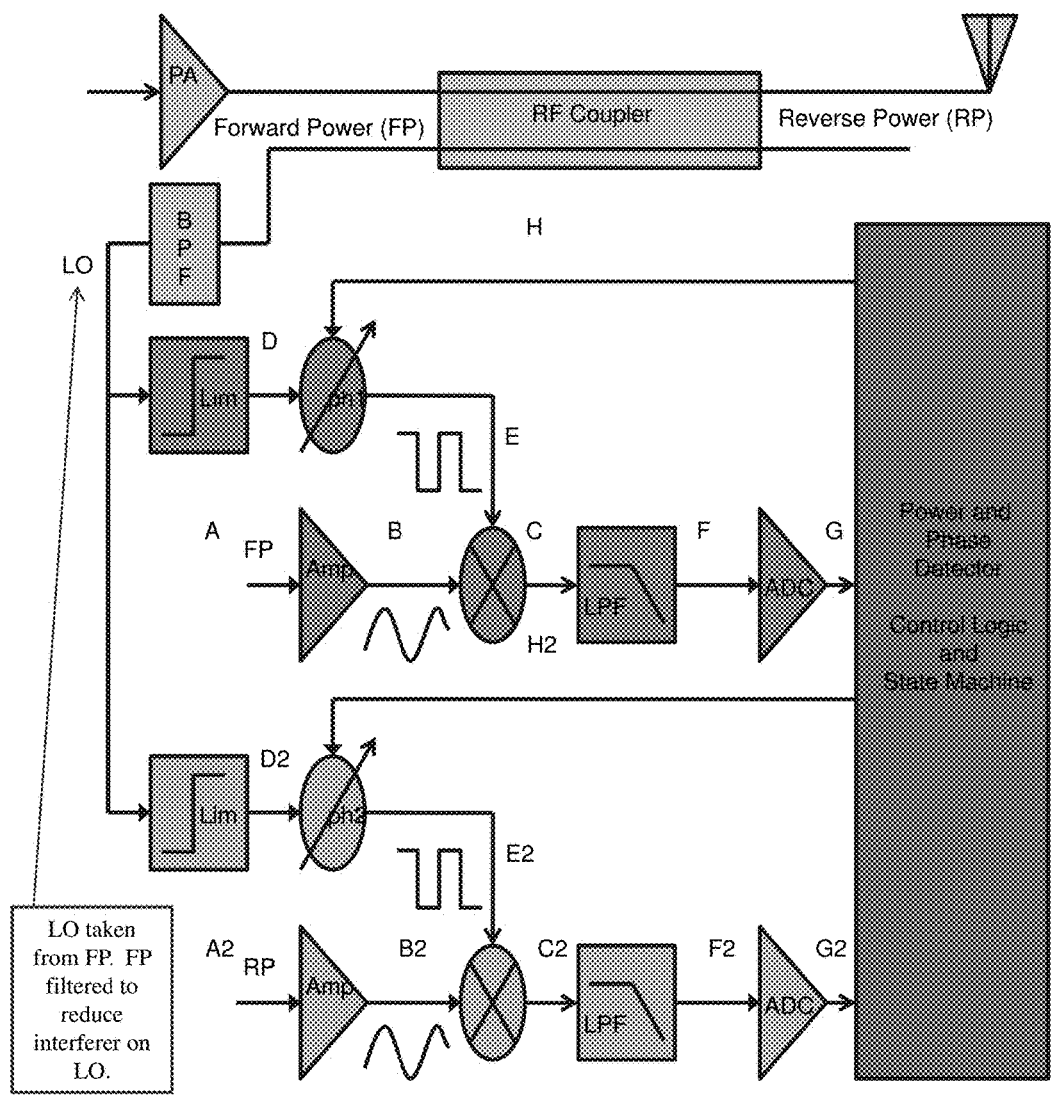

In another exemplary embodiment 1400 shown generally in FIG. 14, the sweeping and computation described with respect to FIG. 12 can be performed. The LO can be taken from the forward power (FP). The FP can be filtered to reduce the effect of the interferer on the LO. In this embodiment, the RF coupler and the bandpass filter can be integrated, such as made from the same ceramic structure.

In the embodiments of 1200-1400, the sensed DC voltage thru the ADC can be used to control the ph1 and the ph2. When the ph1, ph2 is such that the DC voltages are maximized, then the two signals into the mixer are deemed to be in-phase. Ph1 can be adjusted to increase or otherwise make optimum the forward power measurement. Ph2 can also be adjusted to increase or otherwise make optimum the reflected power measurement. The power can be detected when phase difference between the two inputs of the mixer is zero degrees. These exemplary embodiments can ensure that the phase difference does not contribute to the power measurements. The RL can be calculated from the power measurements, and the phase difference is equal to ph2–ph1. The phase difference can be computed after power measurements have been determined for stable phase error measurement. A limiter can remove amplitude modulation on a transmitted signal (desired or undesired modulation). The limiter can act as a filter on forward power signal. Interfering signals may act to increase jitter on FP clock into mixer and can generate odd harmonics. A phase delay can be utilized in measured RF signal path to ensure that the ph1 and ph2 do not go negative. An amplifier can be utilized, but in one embodiment the amplifier can be utilized for only the dynamic range requirements of the mixer. A baseband low pass filter can reject interferers outside of the filter bandwidth. The LPF can also be used to filter out the AM on the modulated signal. If the AM remains, forward and reflected signal can be sampled at the same time. Multiple samples can also be utilized to avoid nulls.

Figure 15:
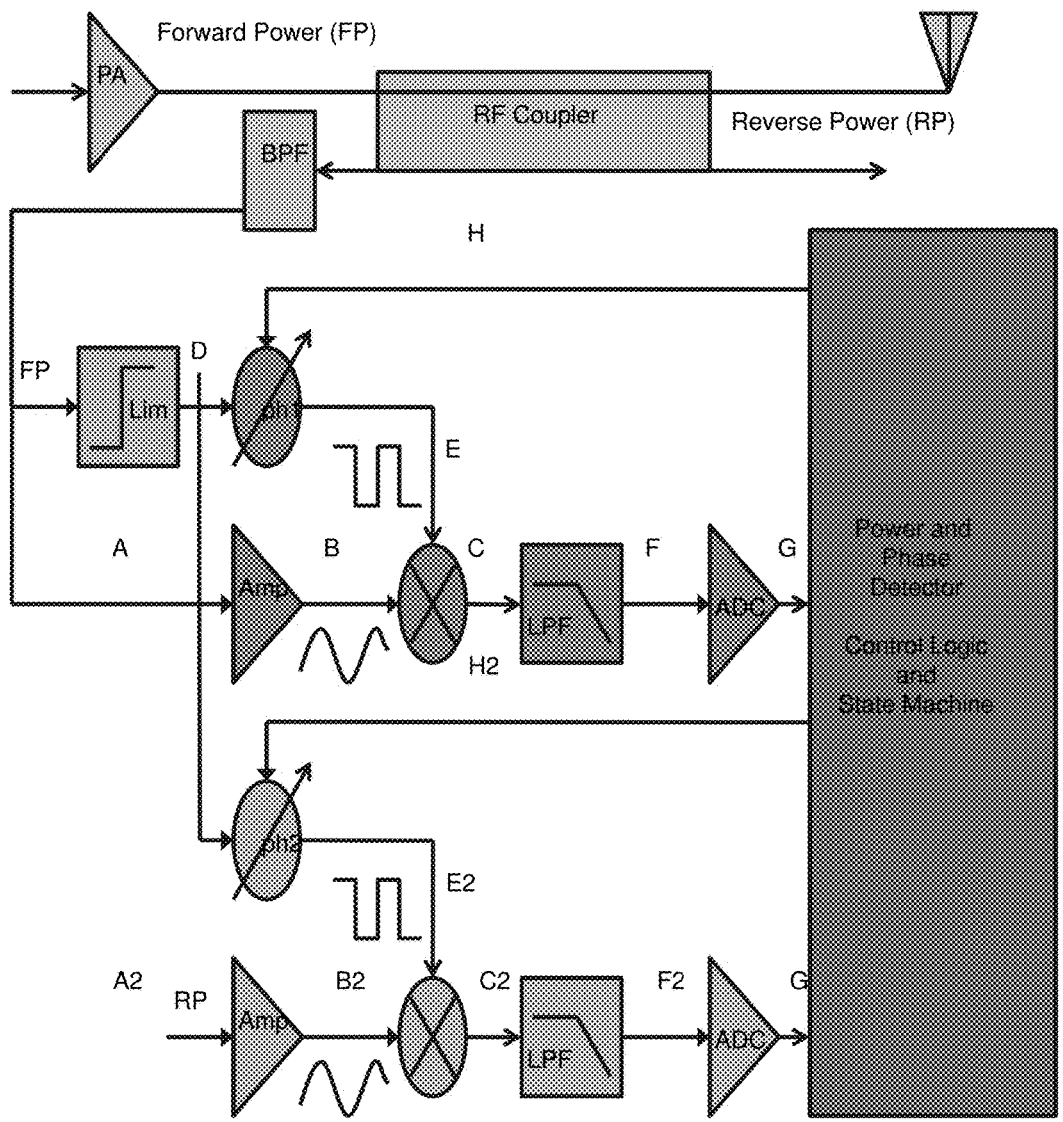

In exemplary embodiment 1500 shown generally in FIG. 15, bandpass and low pass filter(s) (BPF and LPF) can be utilized with a shared limiter. The shared limiter can be utilized to reduce phase error between transmit and reflected measurements. Various other components and configurations can also be utilized to reduce current drain and/or reduce die area. This embodiment allows obtaining data based on filtered forward power.

Figure 16:
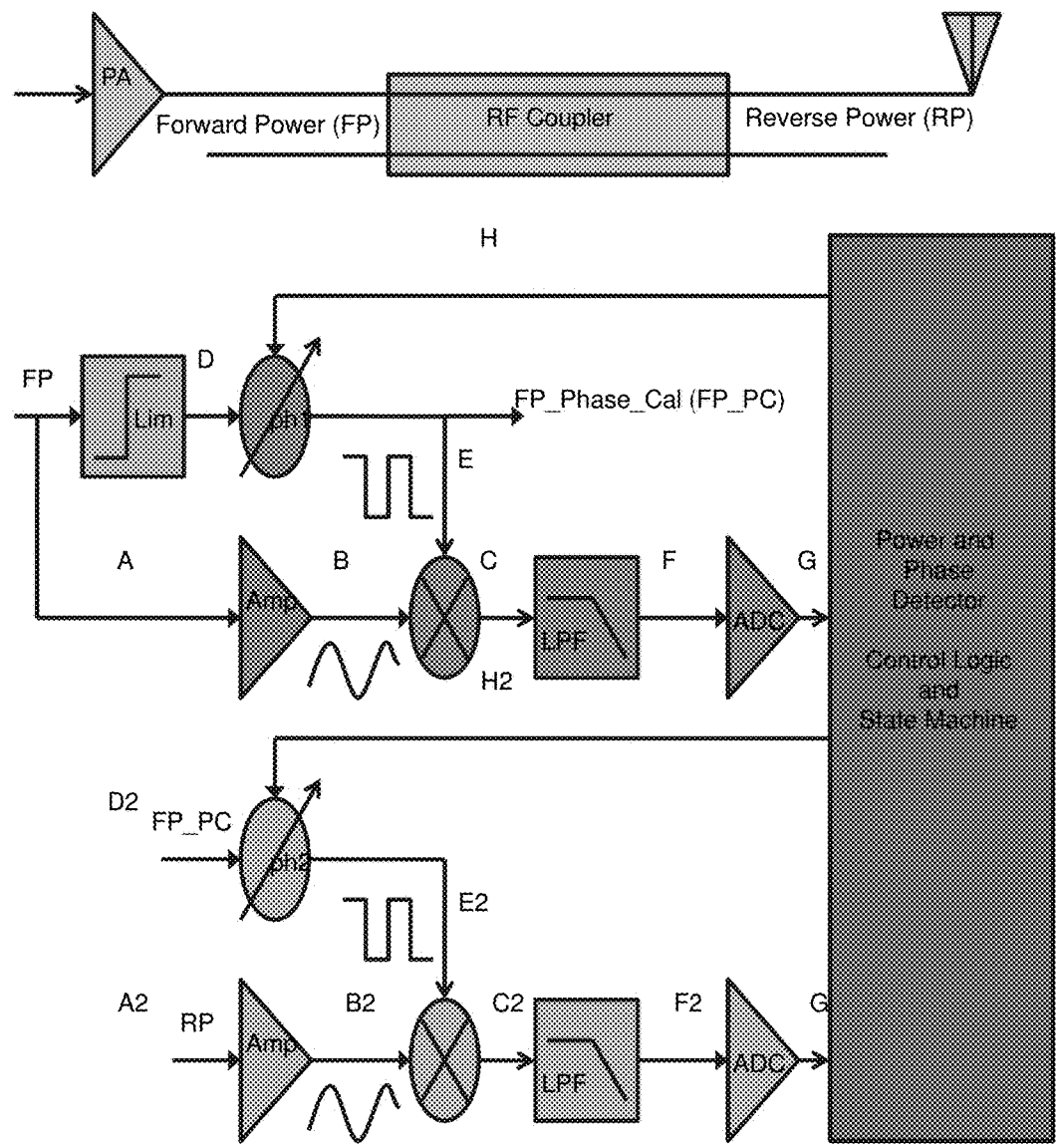

In exemplary embodiment 1600 shown generally in FIG. 16, bandpass and low pass filter(s) (BPF and LPF) can be utilized with a shared delay clock. The shared delayed clock can be utilized to allow for phase difference to be determined by ph2 only. While not shown, a bandpass filter can be utilized, along with one or more other components described in FIGS. 12-15. In one example, embodiment 1600 can utilize a phase-shifted LO from the forward power for the reverse power.

Figure 17:
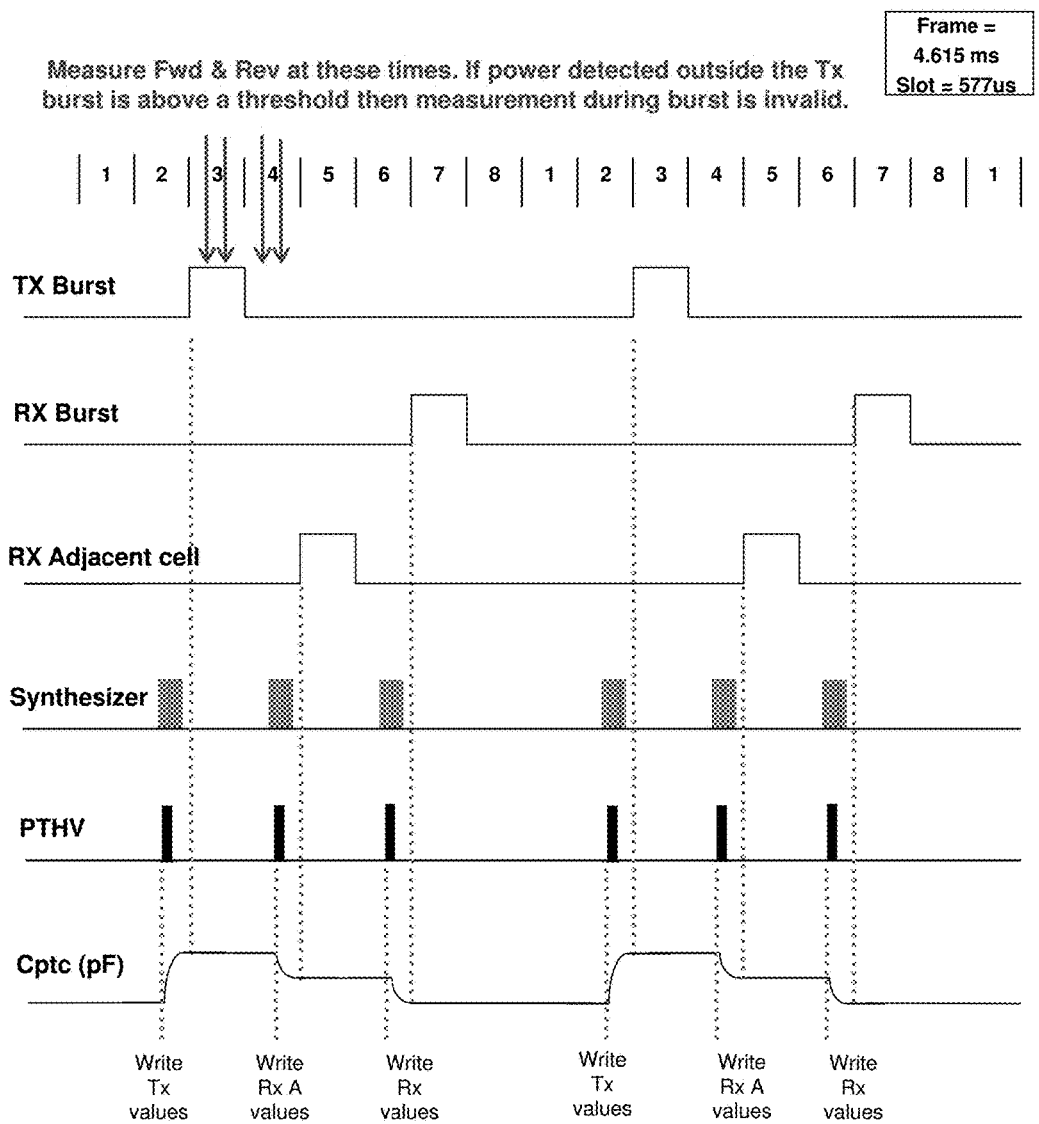
FIGS. 17-18 depict illustrative embodiments of exemplary timing diagrams.

FIG. 17 illustrates an example of timing that can be utilized for one or more of the tuning embodiments described herein, such as for a GSM/EDGE device. Forward and reverse power measurements can be made at the time periods indicated in time slots three and four. If the power detected outside of the transmission burst is above a threshold, then the measurement made during a burst can be deemed invalid. In this embodiment, frames are 4.615 ms and slots are 577 us, however other time periods may also be utilized.

Figure 18:
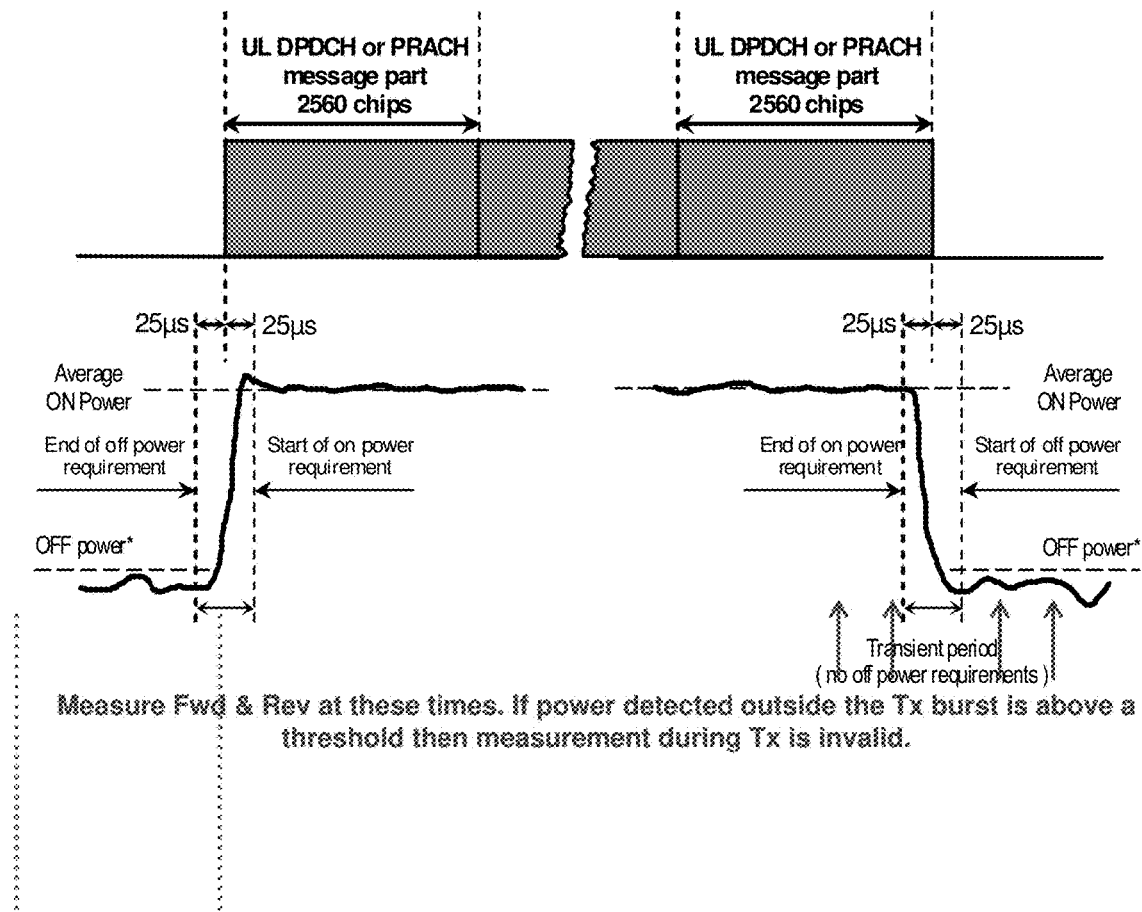

FIG. 18 illustrates an example of timing that can be utilized for one or more of the tuning embodiments described herein, such as for a WCDMA device. Forward and reverse power measurements can be made at the time periods indicated in FIG. 18. If the power detected outside of the transmission burst is above a threshold, then the measurement made during the transmission can be deemed invalid.

A number of techniques can be utilized for validating return loss measurements. Measurements can be deemed invalid if: multiple fast measurements of the reflected port are taken and amplitude variations are detected which exceed the known envelope modulation; multiple fast measurements of transmit minus reflected values show amplitude variations (this method can cancel the transmit modulation and detects an interfering beat note); and multiple fast measurements are taken during transmission, excessive phase variation between measurements can be indicative of an interferer, and if the range of measurements exceeds a set threshold. In one embodiment, when using a "one step" tuning method, which uses impedance measurement to tune to a known match, not seeing a RL after the adjustment within an expected threshold would invalidate the tuning step, and the algorithm would then return to the last known good tuning state.

Additional validity methods, such as through use of peak and average detectors. For example, forward and reverse measurements are done with both Peak and Average detectors and compared. If the error exceeds the expected (modulation) peak-to-average ratio by a set threshold, measurements are deemed invalid. Using Peak and Average detection on the forward minus reverse summed signal can cancel the transmitted modulation and any difference should be due to interference, and thus compared to a set threshold for invalidity.

Figure 19:
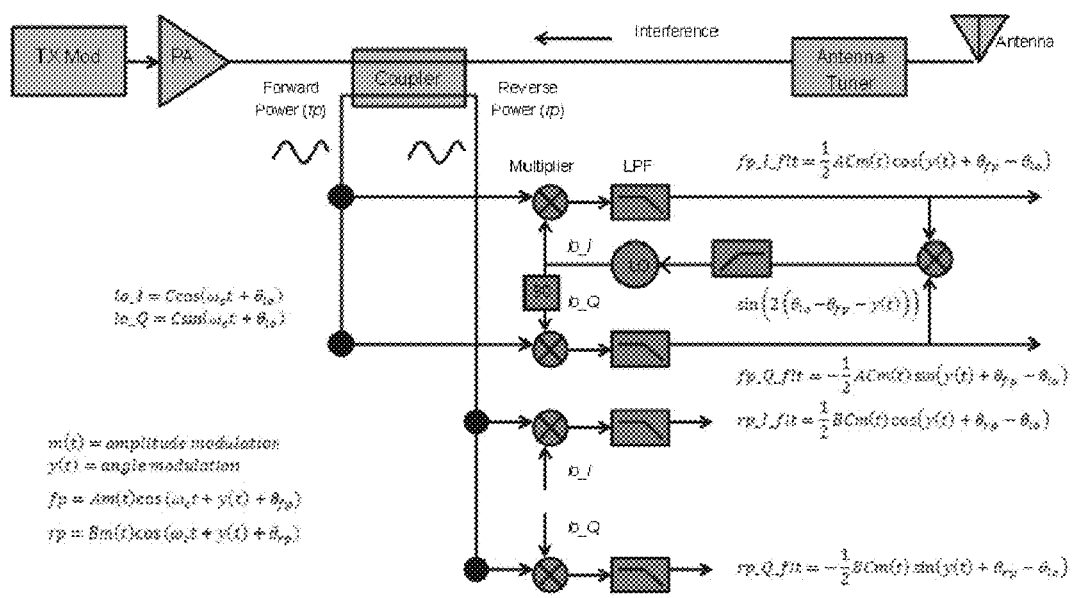
FIG. 19 depicts an illustrative embodiment of a portion of a communication device including a power and phase detector.

In exemplary embodiment 1900 shown generally in FIG. 19, a Costas Loop can be utilized where the forward power is relied upon to lock the local oscillator. The LPF in front of the LO can be set at a low enough frequency to strip off the angle modulation of the TX waveform. In another embodiment, a filter in the forward power path and/or in the reverse power path can be utilized. In another embodiment, where the level of the interferer is low enough, no filter may be needed. Embodiment 1600 can utilize an internal LO that is phase-locked to the forward power without the need for an external LO.

From the foregoing descriptions, it would be evident to an artisan with ordinary skill in the art that the aforementioned embodiments can be modified, reduced, or enhanced without departing from the scope and spirit of the claims described below. For example, the detection of an interferer can be used to determine whether even to perform the algorithm that determines the tunable state. For example, the detection of an interferer can result in the device determining a tuning state based on open-loop feedback rather than closed-loop feedback. Additionally, one or more of the steps described herein can be performed by a component of the transceiver. This can include incorporating particular components into the transceiver or utilizing already existing components of the transceiver. Other suitable modifications can be applied to the present disclosure. Accordingly, the reader is directed to the claims for a fuller understanding of the breadth and scope of the present disclosure.

Figure 20:
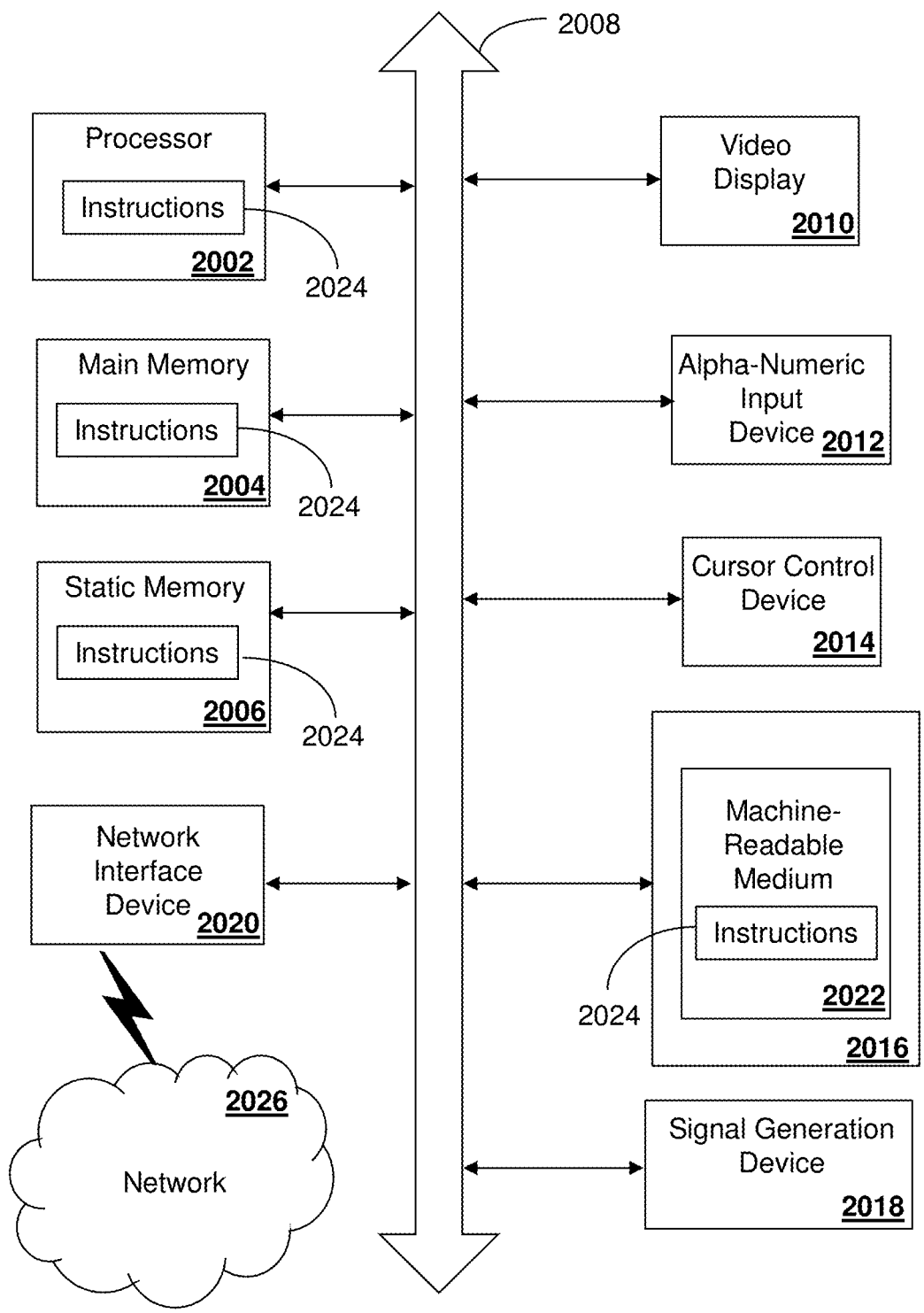
FIG. 20 depicts an exemplary diagrammatic representation of a machine in the form of a computer system within which a set of instructions, when executed, may cause the machine to perform any one or more of the methodologies disclosed herein.

FIG. 20 depicts an exemplary diagrammatic representation of a machine in the form of a computer system 2000 within which a set of instructions, when executed, may cause the machine to perform any one or more of the methodologies discussed above. In some embodiments, the machine operates as a standalone device. In some embodiments, the machine may be connected (e.g., using a network) to other machines. In a networked deployment, the machine may operate in the capacity of a server or a client user machine in server-client user network environment, or as a peer machine in a peer-to-peer (or distributed) network environment.

The machine may comprise a server computer, a client user computer, a personal computer (PC), a tablet PC, a laptop computer, a desktop computer, a control system, a network router, switch or bridge, or any machine capable of executing a set of instructions (sequential or otherwise) that specify actions to be taken by that machine. It will be understood that a device of the present disclosure includes broadly any electronic device that provides voice, video or data communication. Further, while a single machine is illustrated, the term "machine" shall also be taken to include any collection of machines that individually or jointly execute a set (or multiple sets) of instructions to perform any one or more of the methodologies discussed herein.

The computer system 2000 may include a processor 2002 (e.g., a central processing unit (CPU), a graphics processing unit (GPU, or both), a main memory 2004 and a static memory 2006, which communicate with each other via a bus 2008. The computer system 2000 may further include a video display unit 2010 (e.g., a liquid crystal display (LCD), a flat panel, a solid state display, or a cathode ray tube (CRT)). The computer system 2000 may include an input device 2012 (e.g., a keyboard), a cursor control device 2014 (e.g., a mouse), a disk drive unit 2016, a signal generation device 2018 (e.g., a speaker or remote control) and a network interface device 2020.

The disk drive unit 2016 may include a machine-readable medium 2022 on which is stored one or more sets of instructions (e.g., software 2024) embodying any one or more of the methodologies or functions described herein, including those methods illustrated above. The instructions 2024 may also reside, completely or at least partially, within the main memory 2004, the static memory 2006, and/or within the processor 2002 during execution thereof by the computer system 2000. The main memory 2004 and the processor 2002 also may constitute machine-readable media.

Dedicated hardware implementations including, but not limited to, application specific integrated circuits, programmable logic arrays and other hardware devices can likewise be constructed to implement the methods described herein. Applications that may include the apparatus and systems of various embodiments broadly include a variety of electronic and computer systems. Some embodiments implement functions in two or more specific interconnected hardware modules or devices with related control and data signals communicated between and through the modules, or as portions of an application-specific integrated circuit. Thus, the example system is applicable to software, firmware, and hardware implementations.

In accordance with various embodiments of the present disclosure, the methods described herein are intended for operation as software programs running on a computer processor. Furthermore, software implementations can include, but not limited to, distributed processing or component/object distributed processing, parallel processing, or virtual machine processing can also be constructed to implement the methods described herein.

The present disclosure contemplates a machine readable medium containing instructions 2024, or that which receives and executes instructions 2024 from a propagated signal so that a device connected to a network environment 2026 can send or receive voice, video or data, and to communicate over the network 2026 using the instructions 2024. The instructions 2024 may further be transmitted or received over a network 2026 via the network interface device 2020.

While the machine-readable medium 2022 is shown in an example embodiment to be a single medium, the term "machine-readable medium" should be taken to include a single medium or multiple media (e.g., a centralized or distributed database, and/or associated caches and servers) that store the one or more sets of instructions. The term "machine-readable medium" shall also be taken to include any medium that is capable of storing or encoding a set of instructions for execution by the machine and that cause the machine to perform any one or more of the methodologies of the present disclosure.

The term "machine-readable medium" shall accordingly be taken to include, but not be limited to: solid-state memories such as a memory card or other package that houses one or more read-only (non-volatile) memories, random access memories, or other re-writable (volatile) memories; magneto-optical or optical medium such as a disk or tape; and/or a digital file attachment to e-mail or other self-contained information archive or set of archives is considered a distribution medium equivalent to a tangible storage medium. Accordingly, the disclosure is considered to include any one or more of a machine-readable medium or a distribution medium, as listed herein and including art-recognized equivalents and successor media, in which the software implementations herein are stored.

Although the present specification describes components and functions implemented in the embodiments with reference to particular standards and protocols, the disclosure is not limited to such standards and protocols. Each of the standards for Internet and other packet switched network transmission (e.g., TCP/IP, UDP/IP, HTML, HTTP) represent examples of the state of the art. Such standards are periodically superseded by faster or more efficient equivalents having essentially the same functions. Accordingly, replacement standards and protocols having the same functions are considered equivalents.

The illustrations of embodiments described herein are intended to provide a general understanding of the structure of various embodiments, and they are not intended to serve as a complete description of all the elements and features of apparatus and systems that might make use of the structures described herein. Many other embodiments will be apparent to those of skill in the art upon reviewing the above description. Other embodiments may be utilized and derived therefrom, such that structural and logical substitutions and changes may be made without departing from the scope of this disclosure. Figures are also merely representational and may not be drawn to scale. Certain proportions thereof may be exaggerated, while others may be minimized. Accordingly, the specification and drawings are to be regarded in an illustrative rather than a restrictive sense.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter. It is also contemplated that features in one embodiment may be utilized with features of another embodiment.

What is claimed is:

1. A method comprising:
   determining, by a system including a processor, whether measured parameters are valid or invalid based on a phase threshold analysis, wherein the system is integrated in a communication device;
   adjusting, by the system, a tunable reactance circuit of the communication device to a first tuning state according to the measured parameters responsive to a determination that the measured parameters are valid; and
   adjusting, by the system, the tunable reactance circuit to a second tuning state responsive to a determination that the measured parameters are invalid, wherein the second tuning state is one of a default tuning state or a last known tuning state for a use case of the communication device that was previously determined valid,
   wherein the phase threshold analysis is based on detecting an erratic shift between a subset of the measured parameters that is greater than a phase threshold, and wherein the determination that the measured parameters are invalid is based in part on detecting a return loss greater than a return loss threshold.

2. The method of claim 1, wherein the measured parameters comprise parameters associated with forward and reverse power during a transmission burst and between transmission bursts.

3. The method of claim 2, wherein the adjusting of the tunable reactance circuit to the first tuning state comprises determining the first tuning state according to second parameters that are measured during the transmission burst.

4. The method of claim 1, wherein the adjusting of the tunable reactance circuit to the first tuning state according to the measured parameters comprises determining the first tuning state from a look-up table accessible to the system.

5. A communication device, comprising:
   a transceiver;
   a tunable reactance circuit coupled to the transceiver; and
   a processor coupled to the tunable reactance circuit, wherein the processor, responsive to executing instructions, performs operations comprising:
      selecting measurement times for parameters to enable measuring the parameters so that a subset of the parameters are measured outside of a transmission burst;
      measuring the parameters according to the measurement times;
      determining whether the parameters are valid or invalid based on a threshold analysis;
      adjusting the tunable reactance circuit to a first tuning state according to the parameters responsive to a determination that the parameters are valid; and
      adjusting the tunable reactance circuit to a second tuning state responsive to a determination that the parameters are invalid,
      wherein the threshold analysis utilizes a dynamic threshold that is adjusted during operation of the communication device according to a known transmitted power level and a target return loss associated with a use case determined for the communication device and a communication channel being utilized by the communication device.

6. The communication device of claim 5, wherein the second tuning state is a last known tuning state previously determined valid.

7. The communication device of claim 5, wherein the tunable reactance circuit comprises a semiconductor switched capacitor.

8. The communication device of claim 5, wherein the second tuning state is a default tuning state, and wherein the adjusting of the tunable reactance circuit to the first tuning state according to the parameters comprises determining the first tuning state from a look-up table accessible to the processor.

9. The communication device of claim 5, wherein the tunable reactance circuit comprises a semiconductor varactor, a micro-electro-mechanical systems (MEMS) varactor, a semiconductor switched capacitor, a MEMS switched capacitor, or any combination thereof.

10. The communication device of claim 5, wherein the tunable reactance circuit comprises a voltage tunable capacitor.

11. The communication device of claim 5, further comprising a directional coupler coupled between the transceiver and the tunable reactance circuit, wherein the directional coupler enables the measuring of the parameters associated with forward and reverse power.

12. The communication device of claim 5, wherein the adjusting of the tunable reactance circuit to the first tuning state is based in part on the use case of the communication device.

13. A method comprising:
   sampling, by a system including a processor, parameters associated with forward and reverse power, wherein the system is integrated in a communication device, wherein the sampling is performed at a rate and in an amount that enables detection of peaks, nulls or a combination thereof;
   detecting, by the system, an existence of an interferer based on the sampling of the parameters;
   determining, by the system, a tuning state for a matching network of the communication device based on whether the interferer exists;
   adjusting, by the system, the matching network based on the tuning state when the interferer does not exist; and
   adjusting, by the system, the matching network based on a previously determined tuning state when the interferer does exist.

14. The method of claim 13, wherein a time period of the sampling is selected to be at least partially outside of a transmission burst.

15. The method of claim 13, wherein the detecting of the existence of the interferer is based on amplitude modulation.

16. The method of claim 13, wherein the matching network comprises a semiconductor varactor, a micro-electro-mechanical systems (MEMS) varactor, a semiconductor switched capacitor, a MEMS switched capacitor, or any combination thereof.

17. The method of claim 13, wherein the detecting of the existence of the interferer is based on phase measurements outside of a predetermined deviation.

18. The method of claim 13, wherein the detecting of the existence of the interferer is based on a comparison of measured and predicted transmission power level changes.

19. The method of claim 13, wherein the detecting of the existence of the interferer is based on a comparison of measured and predicted improvement in reflected loss.

20. The method of claim 13, wherein the adjusting of the matching network is based on a use case of the communication device.

* * * * *